(12) United States Patent
Norris

(10) Patent No.: US 7,091,737 B2
(45) Date of Patent: Aug. 15, 2006

(54) APPARATUS AND METHODS FOR SELF-HEATING BURN-IN PROCESSES

(75) Inventor: Jeffrey M. Norris, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/956,386

(22) Filed: Oct. 1, 2004

(65) Prior Publication Data
US 2006/0071678 A1  Apr. 6, 2006

(51) Int. Cl.
*G01R 31/26* (2006.01)
(52) U.S. Cl. .................................... 324/765
(58) Field of Classification Search ............... 324/760, 324/765, 158.1, 763, 754, 755–758
See application file for complete search history.

(56) References Cited
U.S. PATENT DOCUMENTS 5,788,084 A * 8/1998 Onishi et al. ............... 209/573
5,966,021 A * 10/1999 Eliashberg et al. ......... 324/760
6,043,671 A * 3/2000 Mizuta ....................... 324/765
6,104,183 A * 8/2000 Kobayashi et al. ...... 324/158.1
6,157,201 A * 12/2000 Leung, Jr. ................... 324/760

* cited by examiner

*Primary Examiner*—Paresh Patel
*Assistant Examiner*—Tung X. Nguyen
(74) *Attorney, Agent, or Firm*—Buckley, Maschoff & Talwalkar LLC

(57) ABSTRACT

A method includes installing a device under test (DUT) into each of a plurality of burn-in boards. The method further includes docking each of the burn-in boards to a respective docking location, each of the burn-in boards with a single respective DUT installed therein. The method further includes subjecting the DUTs to a self-heating burn-in procedure while the burn-in boards are docked to the docking locations. Other embodiments are described and claimed.

15 Claims, 20 Drawing Sheets

APPARATUS AND METHODS FOR SELF-HEATING BURN-IN PROCESSES

BACKGROUND

"Burn-in" is a test procedure commonly applied to integrated circuit (IC) devices in which the devices are exercised at elevated temperature to determine whether defects are present in the devices. Typically, burn-in is applied only to a sample of a lot of devices that have just been manufactured. In conventional burn-in techniques, each device to be burned-in (sometimes referred to as a "device under test" or "DUT") is installed in a socket in a burn-in board. A typical burn-in board may have 15 or more sockets, each containing a DUT during the burn-in.

Once the DUTs have been installed in the sockets of the burn-in board, the burn-in board is placed in an oven, typically in company with other burn-in boards having installed therein other DUTs of the sample of devices being burned-in. The oven is then heated to the target burn-in temperature (e.g., 100° C.) and patterns of drive signals are applied to the DUTs via the burn-in boards during the burn-in period (of, e.g., 30 minutes). The DUTs are monitored during the burn-in and/or tested after burn-in to determine whether the DUTs have failed during burn-in. After the burn-in period is complete, the oven is allowed to cool to room temperature, and the burn-in boards are then removed from the oven. Thereafter, the DUTs are de-installed from the sockets of the burn-in boards, and passed to the next stage of test/manufacture.

Because of cycle time required for populating burn-in boards with DUTs and removing the DUTs from the burn-in boards, loading and unloading burn-in boards to/from the oven, and heating and cooling of the oven, the actual elapsed time to provide a 30 minute burn-in may be several hours. Also, burn-in ovens may occupy a substantial amount of factory floor space.

To overcome these and other disadvantages of conventional burn-in, the present inventor, with another, proposed a "self-heating burn-in" procedure in which the heating of the DUTs from room temperature to the target burn-in temperature results entirely from electrical power dissipation within the DUTs themselves. In other words, no oven is required for "self-heating burn-in". The present inventor has now recognized possible improvements in self-heating burn-in procedures.

DETAILED DESCRIPTION

Figure 1:
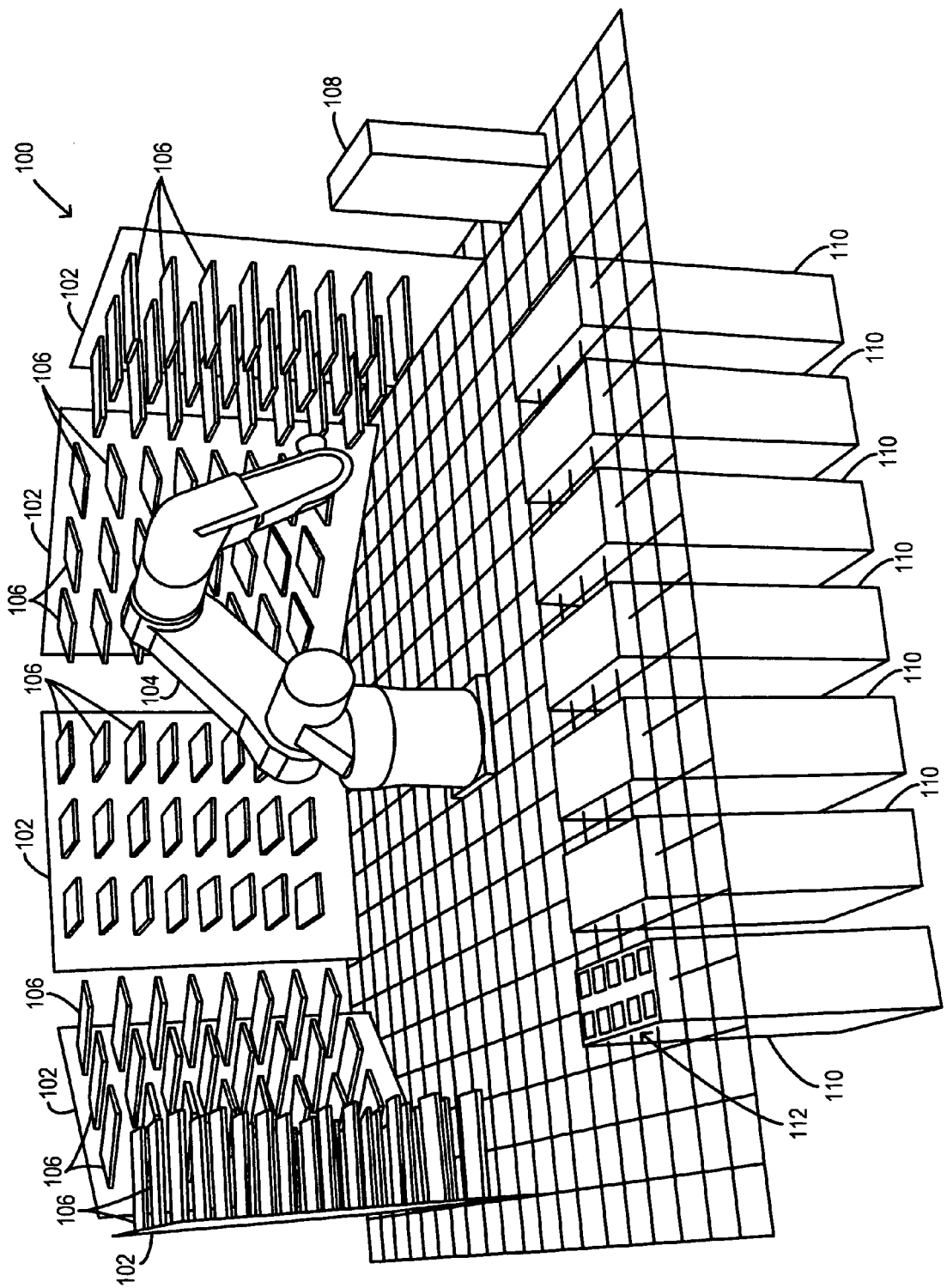
FIG. 1 is a schematic perspective view of a system provided according to some embodiments to perform self-heating burn-in of DUTs.

FIG. 1 is a schematic perspective view of a system 100 provided according to some embodiments to perform self-heating burn-in of DUTs.

The system 100 includes a plurality of vertical support structures 102 arranged at various radial positions around a robotic arm 104 which is also part of the system 100. The support structures may be, for example, walls and/or vertically oriented frames. The support structures may each have mounted thereon columns of docking locations (shown, e.g., in FIG. 6, not separately shown in FIG. 1) to each of which a burn-in board 106 is or may be docked. In some embodiments, each support structure 102 may support three columns of eight docking locations each, as indicated in the drawing. In other embodiments, different numbers of columns per support structure, and/or different numbers of docking locations per column may be provided. The number of support structures in the system 100 may be more or fewer than the five support structures shown in the drawing. As seen from FIG. 1, each docking location may face the robotic arm 104 and thus may face radially inwardly.

In some embodiments, as discussed in more detail below, each burn-in board 106 may have one and only one socket (not separately shown in FIG. 1) to receive and hold a DUT (which may be a packaged IC or other semiconductor device). In some embodiments, each docking location has a respective burn-in board docked to it virtually all the time, except when the burn-in board is away from the docking location to allow a processed DUT (i.e., a DUT for which the burn-in process has been completed) to be replaced with new DUT upon which burn-in is to be performed. In some embodiments, for each burn-in board, a burn-in procedure is taking place for the DUT currently held in the socket of the burn-in board virtually all the time that the burn-in board is docked to the docking location. Consequently, the utilization of the burn-in boards may be highly efficient, since each burn-in board is actually engaged in burning in DUTs a high percentage of the time, with little down-time.

The system 100 may also include an installation station 108 which is accessible by the robotic arm 104. As described further below, the installation station 108 may be operative to de-install a processed DUT from a burn-in board presented to the installation station, and to install a new DUT in the burn-in board.

There may also be included in the system 100 a number of tray holders 110 which hold trays of processed and to-be-processed DUTs. (The trays are not separately indicated, but some DUTs are schematically indicated at 112.) In some embodiments, the tray holders may be suitable for holding stacks of trays that comply with JEDEC (Joint Electron Device Engineering Council) standards. In some embodiments, there may be seven tray holders (as indicated in the drawing) to perform the following functions:

Tray holder no. 1: DUTs to-be-processed from a first lot of DUTs.

Tray holder no. 2: DUTs, from the first lot, that were burned-in successfully.

Tray holder no. 3: DUTs, from the first lot, that failed during burn-in.

Tray holder no. 4: DUTs to-be-processed from a second lot of DUTs.

Tray holder no. 5: DUTs, from the second lot, that were burned-in successfully.

Tray holder no. 6: DUTs, from the second lot, that failed during burn-in.

Tray holder no. 7: empty trays.

As will be appreciated by those who are skilled in the art, the term "lot" as used herein refers to a group of IC devices that are produced in a single production run. Thus, the two lots referred to above are understood to have been produced in separate production runs and/or at different times.

(The order in which the tray holders are listed above need not correspond to an order in which the tray holders are physically positioned in the system 100.)

It will be understood that the tray holders are positioned so as to be accessible by the robotic arm 104.

Figure 2:
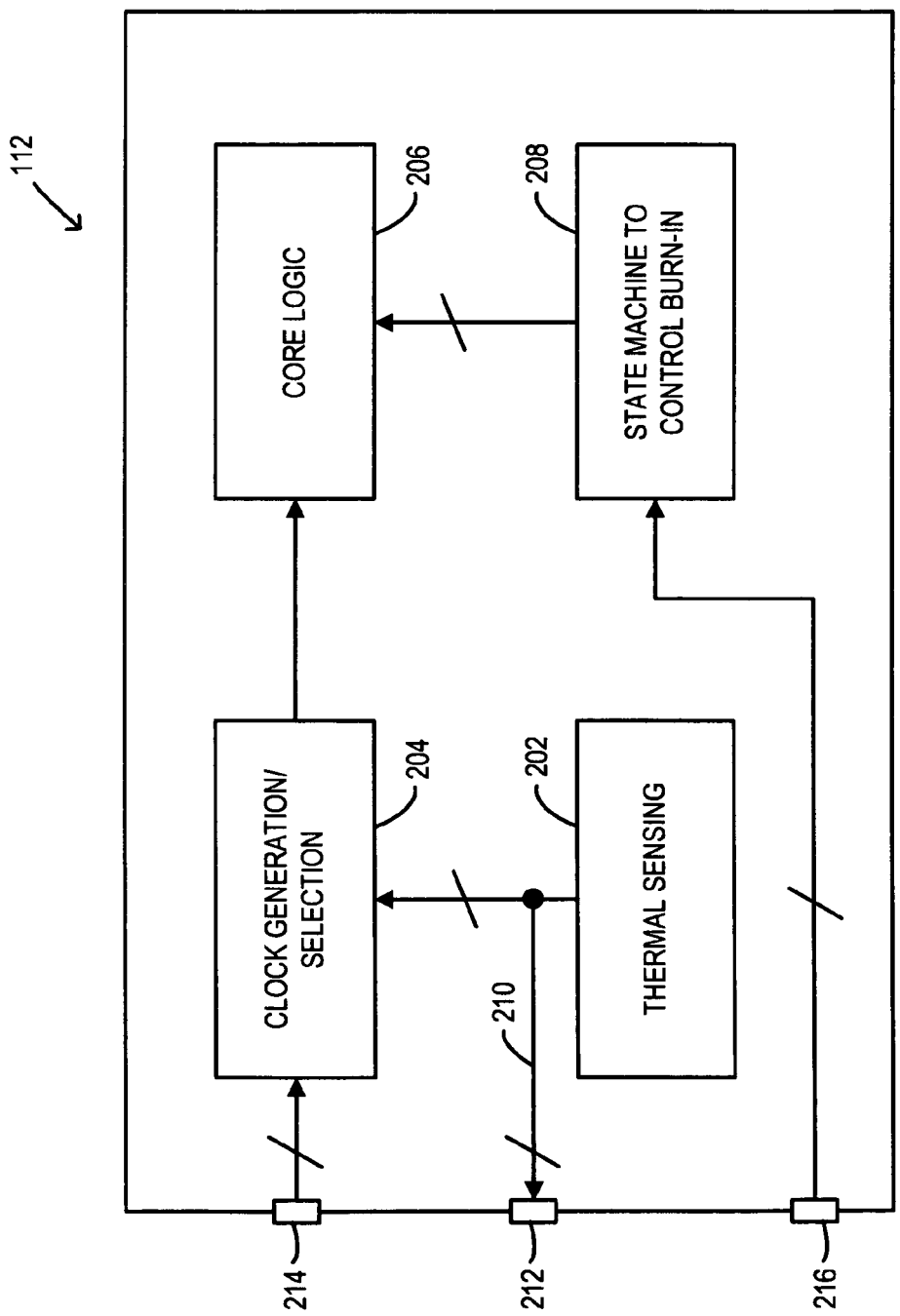
FIG. 2 is a simplified block diagram of a DUT having design-for-test (DFT) features provided according to some embodiments.

FIG. 2 is a simplified block diagram of a typical one of the DUTs 112. The DUT 112 may incorporate design-for-test (DFT) features provided according to some embodiments. In actual physical appearance (not represented in the drawings) the DUT 112 may resemble a conventional packaged IC, notwithstanding the novel features incorporated therein as described below. In addition to features described below, the DUT may have conventional IC device features such as those of a microprocessor, a memory controller hub, a memory device, a graphics chip, etc.

As seen from FIG. 2, the DUT 112 may further include a thermal sensing circuit 202, a clock generation and selection block 204, core logic 206 and a state machine 208. The thermal sensing circuit 202 detects the internal temperature of the DUT. Based on the internal temperature, the thermal sensing circuit 202 sends one or more signals to the clock generation and selection block 204 to select a clock signal at an appropriate frequency. The core logic 206 may include a considerable number of logic gates (to implement conventional functions of the device) and may receive the selected clock signal provided by the block 204 to operate at the frequency of the selected clock signal. The state machine 208 may control the core logic 206 during burn-in to run various test modes.

As indicated at 210 in FIG. 2, the signal or signals provided by the thermal sensing circuit 202 to the clock generation and selection block 204 may also be taken out to a terminal pin or pins 212, so that the signal(s) from the thermal sensing circuit 202 may be received externally from the DUT 112. At other terminal pins 214 input signals (e.g., clock signals of mutually different phases) for the clock generation and selection block 204 may be received from off the DUT. Also, a control signal or signals to trigger the state machine 208 may be received from off the DUT at terminal pin(s) 216.

Figure 3:
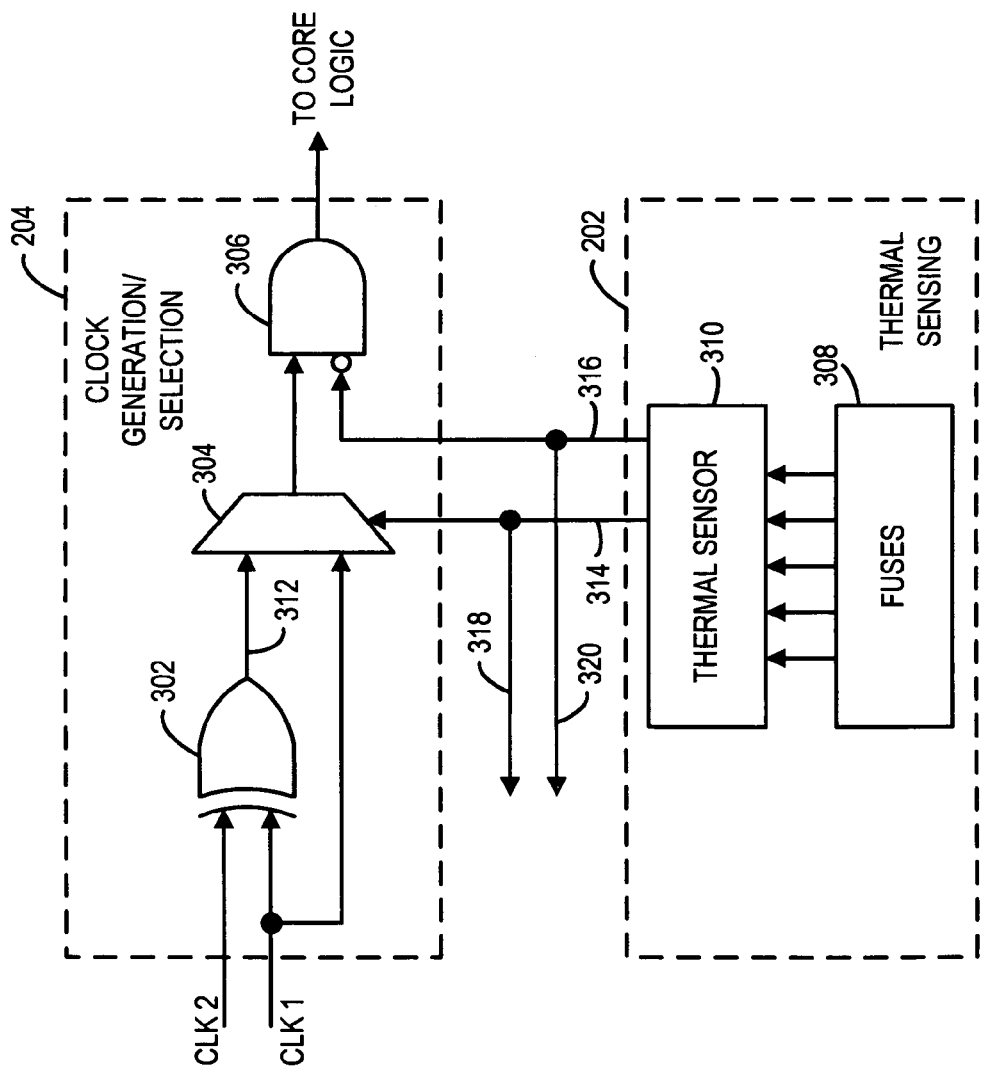
FIG. 3 is a partly schematic, partly block diagram showing details of DFT features of the DUT of FIG. 2.

FIG. 3 shows some details of the thermal sensing circuit 202 and the clock generation and selection block 204 as provided according to some embodiments. As will be understood from subsequent discussion, the circuitry shown in FIG. 3 may function as on-die temperature control circuitry to aid in controlling a self-heating burn-in mode of the DUT. The circuitry of FIG. 3 may constitute a portion of the DFT circuitry of the DUT.

As seen from FIG. 3, the clock generation and selection block 204 includes an exclusive OR (XOR) gate 302, a multiplexer 304, and an AND gate 306. The thermal sensing circuit 202 includes a number of fuses 308 and an on-die thermal sensor 310.

The XOR gate 302 receives two clock signals which may be of the same frequency (e.g., 10 MHz) but with mutually different phases (e.g., shifted by 90° from each other). The input clock signals for the XOR gate 302 may be provided from the burn-in board or from an external driver circuit (not shown in FIG. 3) which is discussed below. The frequency of the input clock signals may vary depending on the target burn-in temperature and time.

Using the two phase-shifted clock signals, the XOR gate 302 generates a clock signal 312 which has a frequency that is twice the frequency of the input clock signals. For example, in one embodiment, if the input clock signals are at 10 MHz with a 90° phase shift, then the output clock signal 312 from the XOR gate 302 is at 20 MHz. The output clock signal 312 and one of the input clock signals are both provided as inputs to the multiplexer 304. The multiplexer 304 selects a clock signal out of the two clock signals input thereto in response to a signal 314 from the thermal sensing circuit 202. (In some embodiments, more than two clock signals, all at different frequencies, may be provided to the multiplexer 304 for the multiplexer to select among based on a signal from the thermal sensing circuit 202.)

In one embodiment, the fuses 308 may include five programmable fuses coupled to the thermal sensor 310. The fuses 308 may be programmable to different temperature levels. The fuses 308 may be programmed during wafer level sort testing of the DUT to set a target burn-in temperature. In one embodiment, the target burn-in temperature may be in the range 90–100° C. It should be understood that the target burn-in temperature may vary in different embodiments, depending on a variety of factors, such as process variations, burn-in time, etc. Also, the DUT may include additional fuses programmed to set more than one temperature level.

In one embodiment, the fuses 308 provide the programmed target burn-in temperature to the thermal sensor 310. The thermal sensor 310 senses the internal temperature of the DUT and compares the sensed temperature with the programmed burn-in temperature. In response to the comparison, the thermal sensor 310 generates a number of output signals. In one embodiment, the output signals of the thermal sensor 310 include the signal 314 (which may be considered to be a "too hot" signal) to indicate that the sensed internal temperature of the DUT exceeds the target temperature. In one embodiment, the thermal sensor 310 further generates a backup signal 316 that is asserted in the event that the sensed internal temperature of the DUT exceeds the target temperature by a certain amount (e.g., 10 or 12° C. in some embodiments). Signal 316 may be considered a "catastrophic" signal.

In one embodiment, the "too hot" signal 314 is provided to the multiplexer 304 to select a clock signal for the core logic (FIG. 2, not shown in FIG. 3). When the internal temperature of the DUT is below the target temperature, it may be desirable to run the DUT at a higher frequency to generate more heat in order to raise the internal temperature to the target temperature. On the other hand, when the internal temperature of the DUT is above the target temperature, it may be desirable to run the DUT at a lower frequency to generate less heat. For example, in one embodiment, the multiplexer 304 selects the 10 MHz clock signal for the core logic when the signal 314 from the thermal sensor 310 indicates that the internal temperature of the DUT exceeds the target temperature, and the multiplexer 304 selects the 20 MHz clock signal for the core logic when the signal 314 indicates that the internal temperature of the DUT does not exceed the target temperature. The selected clock signal from the multiplexer 304 and the "catastrophic" signal 316 are provided as inputs to the AND gate 306.

By selecting between the higher and lower clock frequencies during burn-in, the temperature control circuitry of FIG. 3 may be able to vary the power dissipated by the DUT during burn-in by about 10 watts. By toggling back and forth between the two clock frequencies, the temperature control circuitry may be able to stabilize the DUT internal temperature at the target burn-in temperature. However, for some devices the power range may exceed the capabilities of the temperature control circuitry to stabilize the temperature just by frequency toggling. Consequently, it is now proposed that the "too hot" signal 314 be taken off, as indicated at 318, to be provided to one of the terminal pins 212 (FIG. 2). From that terminal pin 212, the "too hot" signal may be provided to an external device (discussed below, not shown in FIGS. 2 and 3) in order to control an external cooling device dedicated to the docking location at which the DUT is being burned in.

In one embodiment, the "catastrophic" signal 316 may be applied in inverted form to the AND gate 306, so that the AND gate 306 passes the clock signal selected by the multiplexer 304 when the "catastrophic" signal 316 is "0" (not asserted). When the "catastrophic" signal 316 is "1" (asserted), the AND gate blocks off the clock signal from the core logic and essentially places the DUT in an inactive mode. With no gate toggling occurring, the DUT may then cool off more rapidly than when the lower frequency clock signal is applied to the core logic. As the DUT cools to a temperature below the pre-programmed "catastrophic" set point, the thermal sensor 310 switches the signal 316 to "0" to allow the AND gate 306 to pass the clock signal output from the multiplexer 304. The DUT therefore again runs using that clock signal. Thus the output of the AND gate 306 is equivalent to an internal temperature sensitive variable speed clock signal for the core logic.

It is possible that even with the clock signal gated off from the core logic, power dissipation due to leakage currents may be sufficient to prevent the DUT from cooling from the "catastrophic" temperature level. Consequently, it is now further proposed that the "catastrophic" signal 316 also be taken off, as indicated at 320, to be provided to one of the terminal pins 212 (FIG. 2). From that terminal pin, the "catastrophic" signal may be provided to an external device (discussed below, not shown in FIGS. 2 and 3) in order to switch off the power supply for the docking location at which the DUT is being burned in. With this arrangement, there may be theoretically no limit to the power dissipation level of DUTs for which the docking location could still function successfully.

From the foregoing, it will be understood that the thermal sensing circuit operates to monitor the internal temperature of the DUT. Moreover, one of terminal pins 212 coupled to the thermal sensing circuit provides a signal external to the DUT to indicate whether the internal DUT temperature exceeds a threshold temperature that corresponds to the target burn-in temperature set point. Another one of the terminal pins 212, also coupled to the thermal sensing circuit, provides another signal external to the DUT to indicate whether the internal DUT temperature exceeds another threshold temperature that corresponds to the "catastrophic" temperature set point.

It will also be appreciated that the DUT may incorporate other circuitry, which is not shown, to disable blocks 202, 204, 208 when the DUT is not undergoing self-heating burn-in and to supply another clock signal, suitable for normal operation of the DUT, to the core logic 206.

Figure 4:
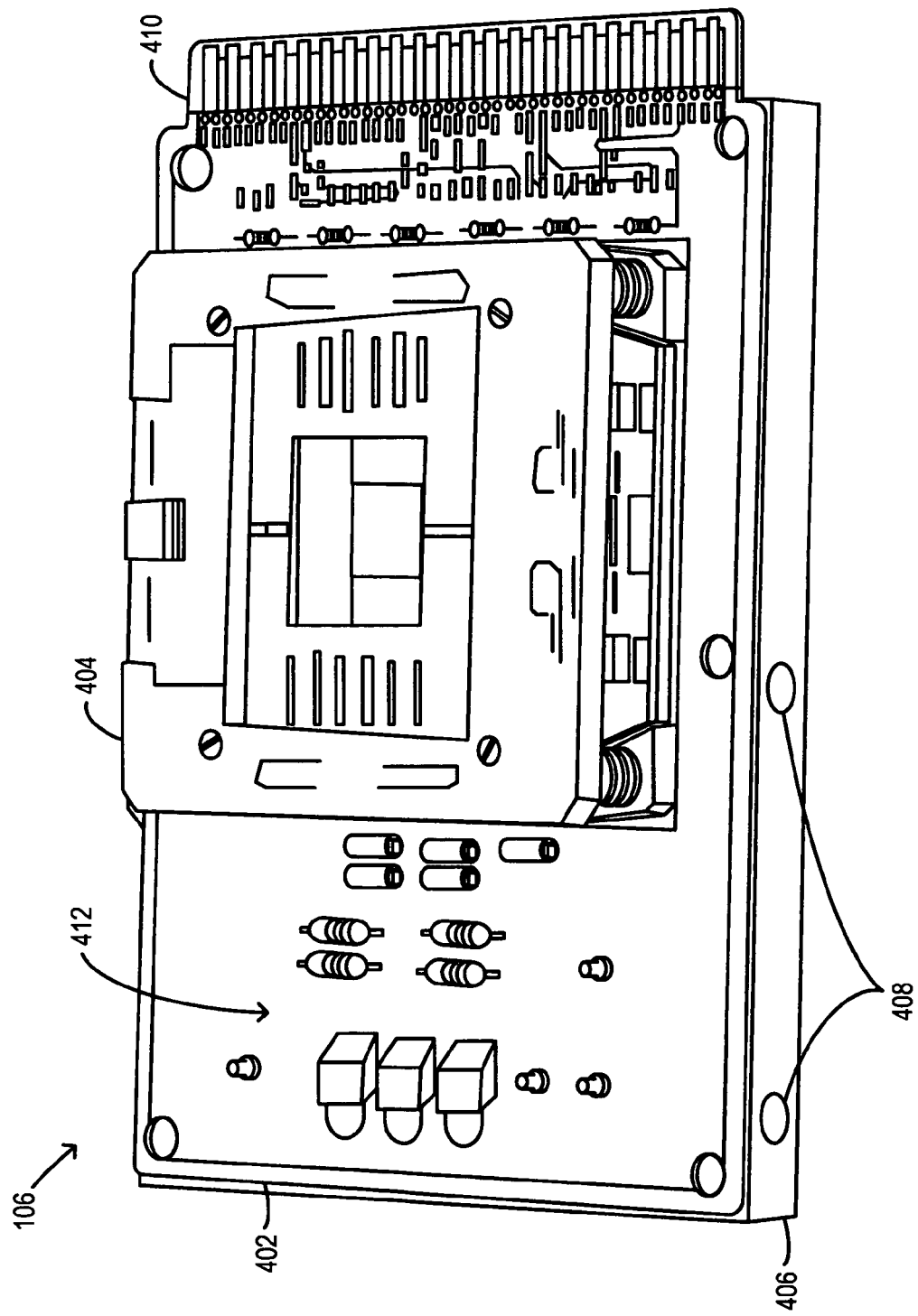
FIG. 4 is perspective view of a burn-in board provided according to some embodiments.

FIG. 4 is a perspective view of a typical one of the burn-in boards 106, as provided according to some embodiments. As seen from FIG. 4, the burn-in board 106 includes a board substrate 402 on which one and only one socket 404 is mounted. The socket 404 is suitable for receiving and holding a DUT and interfacing the DUT to other components on the burn-in board 106. The substrate 402 may be installed on a metal frame 406 that is also part of the burn-in board 106. The metal frame may have laterally facing holes 408 (only two visible in FIG. 4) on both sides of the frame to facilitate secure handling of the burn-in board by the robotic arm 104 of the system 100.

The burn-in board may also include an edge connector 410 which runs along one edge of the burn-in board. The edge connector may allow for coupling of signals (as well as power and ground) between the burn-in board and a connector (not separately shown) on one of the docking locations. In addition, other components of the burn-in board 106 are present in a region 412 shown in FIG. 4.

Figure 5:
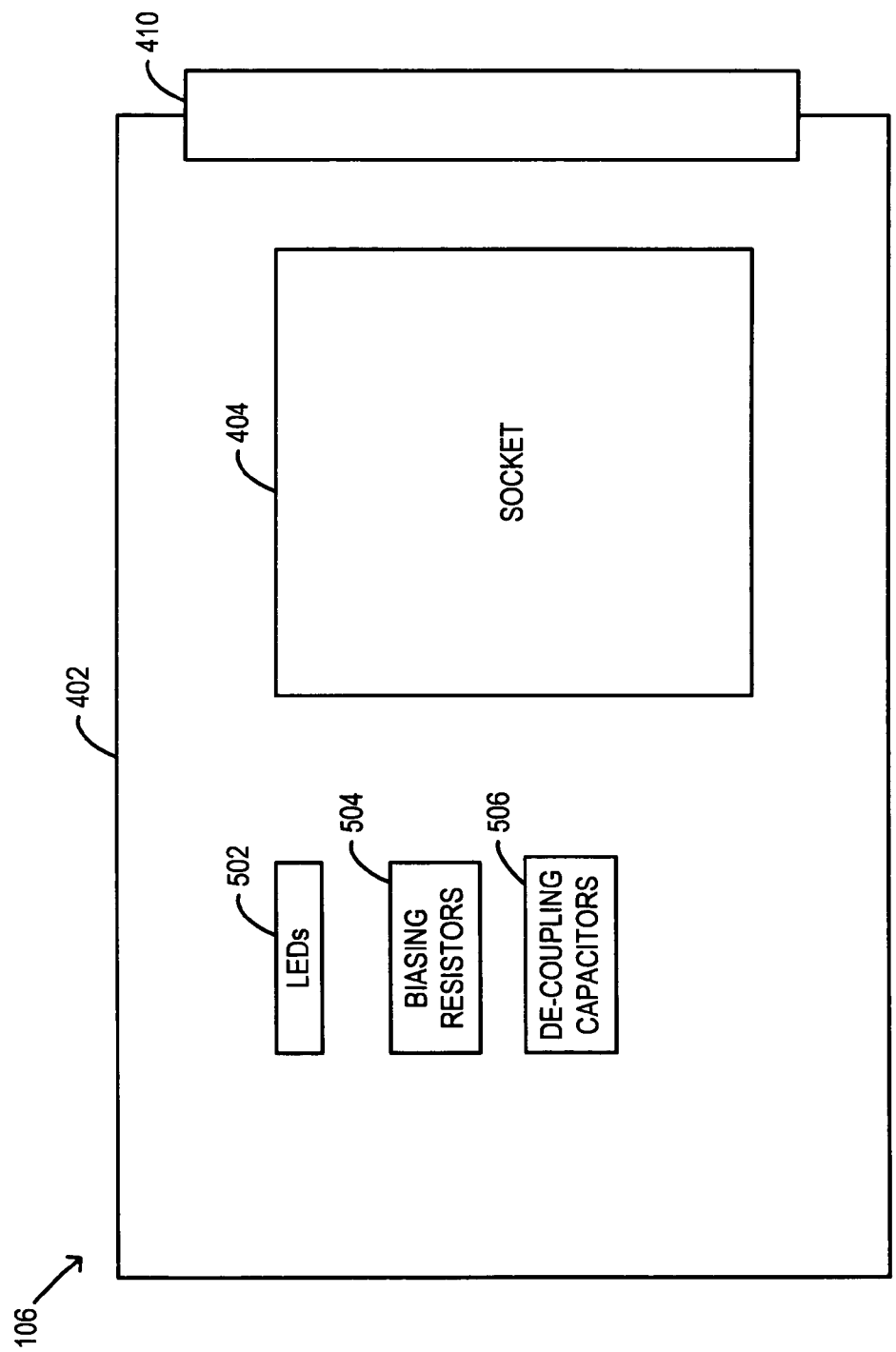
FIG. 5 is a block diagram representation of the burn-in board of FIG. 4.

FIG. 5 is a block diagram representation of the burn-in board 106 shown in FIG. 4. Shown in FIG. 5 are the substrate 402, socket 404 and edge connector 410. Other components of the burn-in board 106 include LEDs (light emitting diodes) 502, biasing resistors 504 and de-coupling capacitors 506.

The LEDs 502 may include a green LED which blinks when the burn-in procedure is proceeding normally for a DUT (not shown in FIG. 5) held in the socket 404, a yellow LED that is turned on during operation of a fan (discussed below) at the docking location to which the burn-in board is docked, and a red LED that is turned on when the DUT is outputting the "catastrophic" signal described above.

Figure 6:
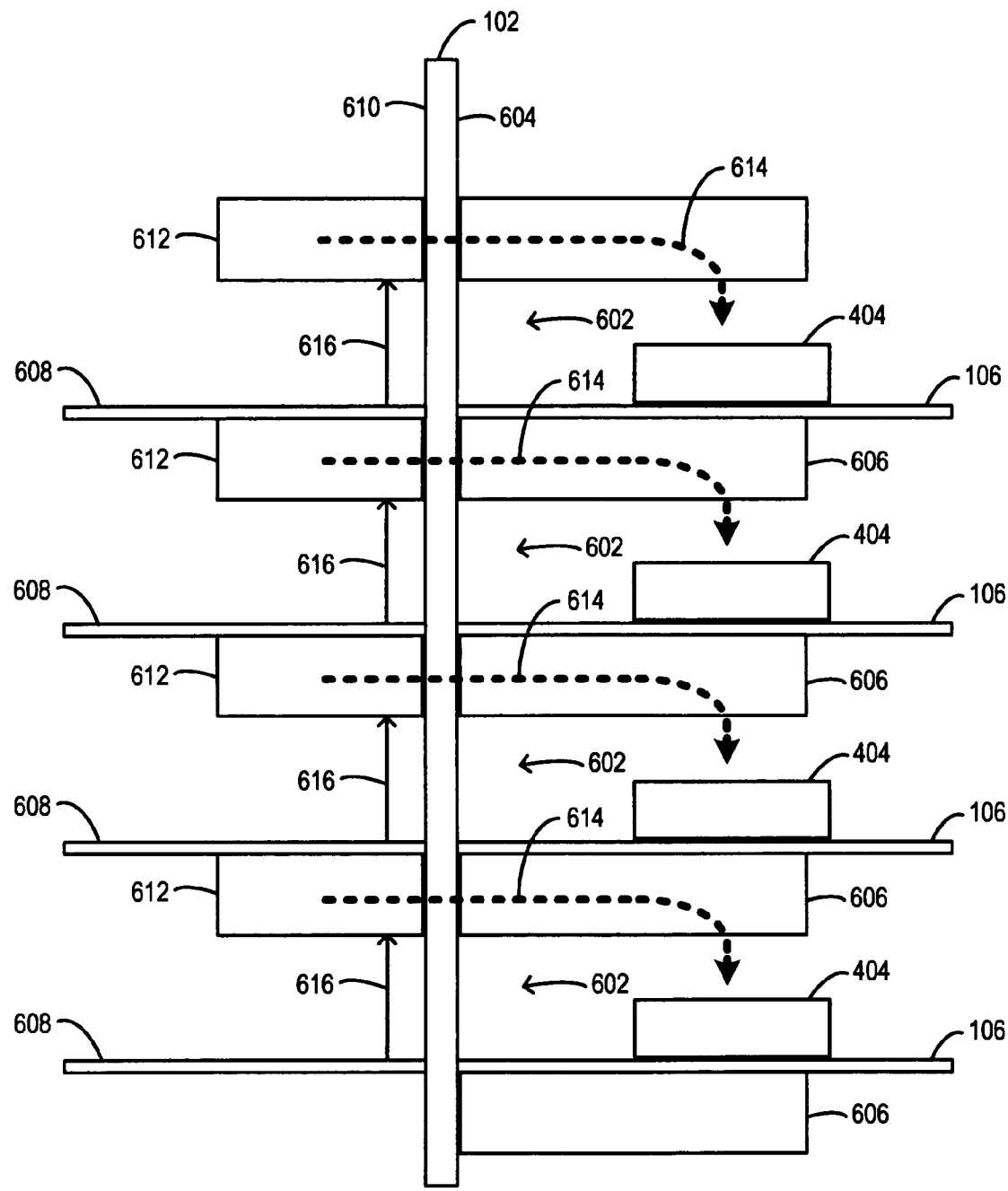
FIG. 6 is a schematic side cross-sectional view of a column of docking locations for docking burn-in boards in the system of FIG. 1.

FIG. 6 is a schematic side cross-sectional view of a column of docking locations 602 mounted on a typical one of the support structures 102 (FIG. 1) of the system 100. (Although four docking locations 602 are shown in FIG. 6, it will be understood that columns of docking locations on the support structures may include more or fewer than four docking locations.)

A respective burn-in board 106 is shown docked to each of the docking locations 602 on a front side 604 of the support structure 102. The socket 404 of each burn-in board 106 is also shown, and it is to be understood that a respective DUT (not separately shown) is held in each socket 404.

Each docking location 602 includes a respective support member 606 on which the respective burn-in board 106 is supported. The support member 606 may extend horizontally from the front side 604 of the support structure 102. The support member may include roller bearings (not separately shown) or the like to facilitate docking of the burn-in board to the docking location 602.

In addition, each docking location 602 includes a connector (not separately shown) to couple to the edge connector 410 (FIGS. 4 and 5; not separately shown in FIG. 6) of the burn-in board 106 docked to the docking location.

Further, each docking location 602 includes a driver circuit 608 mounted on the rear side 610 of the support structure 610 positioned opposite the burn-in board docked to the corresponding docking location 602. Aspects of the driver circuit 608 will be described below. The driver circuit is coupled to the burn-in board to exchange signals with the burn-in board and to provide power to the burn-in board.

Still further, each docking location 602 may include a fan 612 to selectively provide a stream of air (represented by dashed arrow 614) to selectively cool the DUT (not separately shown) installed on the burn-in board 106 docked at the docking location. In some embodiments, each fan 612 may be a so-called "squirrel cage" variable speed fan such as the Panasonic model FAL5F12LH 12 volt brushless fan available from Matsushita. Each fan 612 may be controlled by a respective PWM (pulse width modulation) control signal schematically indicated at 616 and provided by the respective driver circuit 108 of the docking location 602 to which the fan 612 belongs. In some embodiments the fan control signal 616 is generated by the respective driver circuit 608 at least partially in response to the "too hot" signal 318 (FIG. 3) output from the DUT (not separately shown) installed in the burn-in board 106 docked to the docking location of which the respective fan 612 is a part. Each fan may, for example, be capable of generating an air flow on the order of about ten cubic feet per minute.

Each docking location 602 may further include a duct to direct the air stream 614 from its fan 612 to the DUT being burned in at the docking location. In some embodiments, at least some of the ducts may each be integrated with (formed in) the support member 606 that is part of the docking location that is immediately above the docking location in question. That is, at least some of the support members 606 may be at least partially hollow to form a respective duct to direct air from a respective fan 612 to a respective socket 404 to cool a DUT (not separately shown) installed in the socket. Assuming that the fan 612 supplies an air flow of ten cubic feet per minute, the duct may have an outlet sized to provide an airflow of about 640 linear feet per minute (or 1200 LFM in other embodiments).

In some embodiments, the fan 612 may be turned on and off by the driver circuit 608 in response to the DUT in question asserting or de-asserting the "too hot" signal. In other embodiments, the fan provides at least a trickle of air throughout burn-in and the volume of air provided by the fan is selectively ramped up (i.e., the fan speed is selectively ramped up) in response to periods of time in which the DUT asserts the "too hot" signal. In some embodiments, the air stream provided by the fan at maximum speed may be sufficient to dissipate up to 85 watts of power.

In some embodiments, another type or types of cooling device may be included in each docking location in addition to or instead of the fans. The other type or types of cooling device may include a device which circulates a liquid coolant to cool the DUT, a thin film thermoelectric cooling device and/or a Peltier plate. In each case the amount of cooling provided by the cooling device or devices may be controlled in response to the "too hot" signal output from the DUT.

Figure 7:
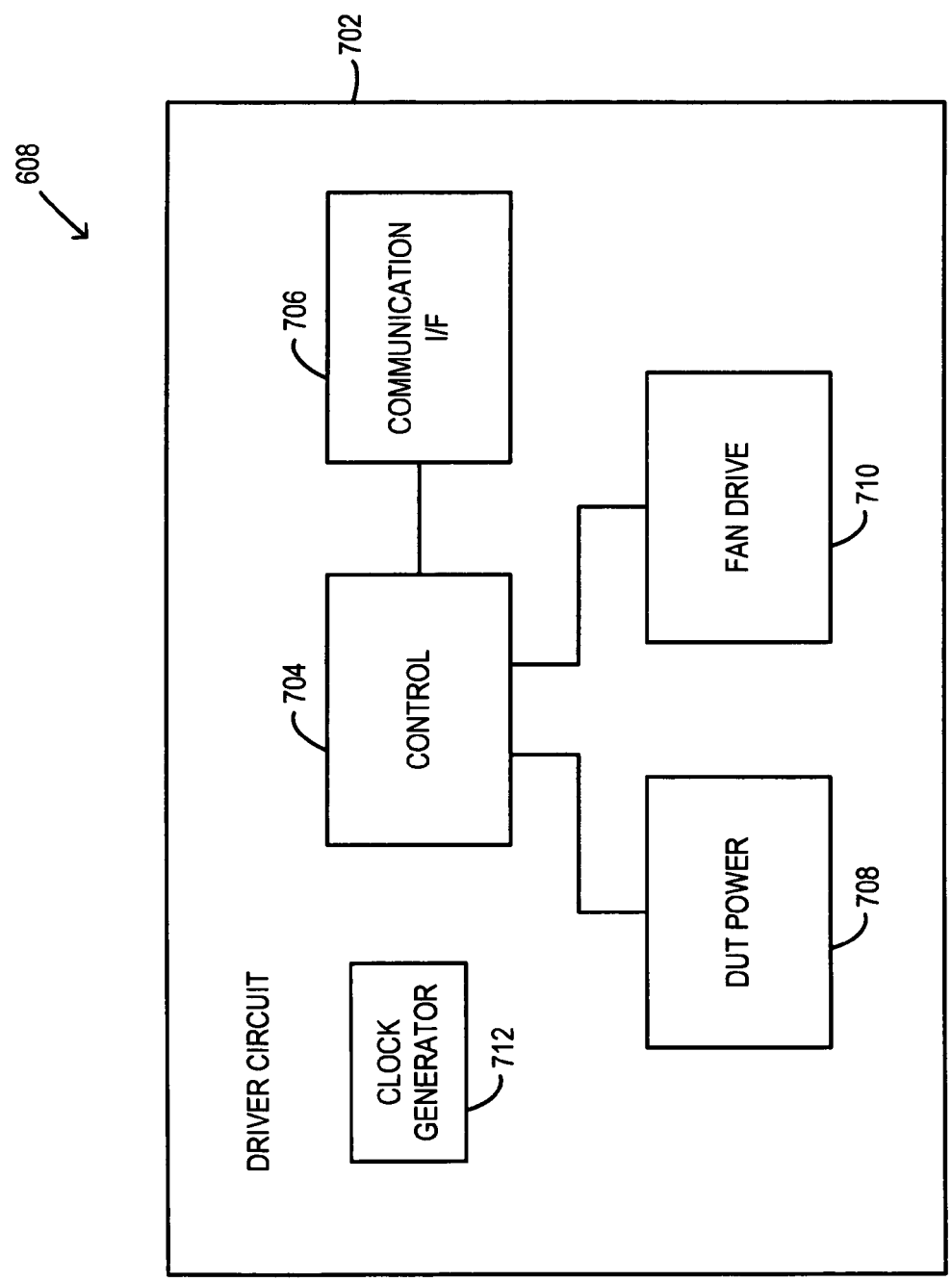
FIG. 7 is a block diagram representation of a driver circuit that is part of the system of FIG. 1.

FIG. 7 is a block diagram representation of a typical one of the driver circuits 608 shown in FIG. 6. The driver circuit 608 may include a board substrate 702. In its physical embodiment the board substrate may have similar dimensions to the board substrate of the burn-in board, say about four inches by six inches. The other components of the driver circuit 608, enumerated below, may all be mounted on the board substrate 702.

The driver circuit 608 may include a control circuit 704, one or more communication interfaces 706, a DUT power supply 708, a fan drive circuit 710 and a clock signal generator 712. The communication interface(s) 706 are coupled to the control circuit 704 to allow the control circuit 704 to exchange communications with other components of the system 100. The DUT power supply 708 and the fan drive circuit 710 are coupled to the control circuit 704 to be controlled by the control circuit 704.

The DUT power supply may include a MOSFET (metal oxide semiconductor field effect transistor) to control the supplying of power to the burn-in board 106 and hence to the DUT that is being burned in at the docking location of which the driver circuit is a part. The control circuit 704 may turn off the DUT power supply 708 in response to receiving the "catastrophic" signal from the DUT.

The fan drive circuit 710 selectively provides a drive signal to the fan 612 (FIG. 6) to control the fan in response to the "too hot" signal provided from the DUT to the driver circuit 608. The control circuit 704 may be arranged to detect failure of the associated fan by monitoring the power drawn (or failure to draw power) by the fan. If necessary the control circuit may signal to the system controller (described below) to indicate failure of the fan.

The clock signal generator 712 may provide the two phase-shifted clock signals for the clock generation and selection block 204 (FIGS. 2 and 3) of the DUT. These clock signals are coupled to the DUT via the burn-in board 106. (In some embodiments, the clock signal generator may be provided on the burn-in board rather than as part of the driver circuit.)

The control circuit 704 may, in some embodiments, be implemented as a PLD (programmable logic device). In addition to controlling the DUT power supply 708 and the fan drive circuit 710 in response to signals output from the DUT, the control circuit 704 may perform the function of generating suitable signals to initialize the state machine 208 (FIG. 2) of the DUT so that the DUT is exercised as required during the burn-in procedure. The control circuit 704 may also detect whether the burn-in procedure properly commences upon triggering the state machine. In effect, in this way the control circuit may also detect whether the docking of the burn-in board to the docking location was successful and whether the DUT is properly installed in the burn-in board socket. If either of these is not the case, the burn-in board will not properly draw power from the power supply 708, which may be detected by the control circuit 704.

The control circuit 704 may also monitor results of the burn-in procedure. For example, the control circuit 704 may detect whether the DUT successfully completes the burn-in procedure or fails during the burn-in procedure. In addition, the control circuit 704 may communicate with a system controller (to be discussed below) to report events or conditions such as failure to commence burn-in properly, failure of the DUT during burn-in, or shutting off of power to the DUT in response to the "catastrophic" signal from the DUT.

Figure 8:
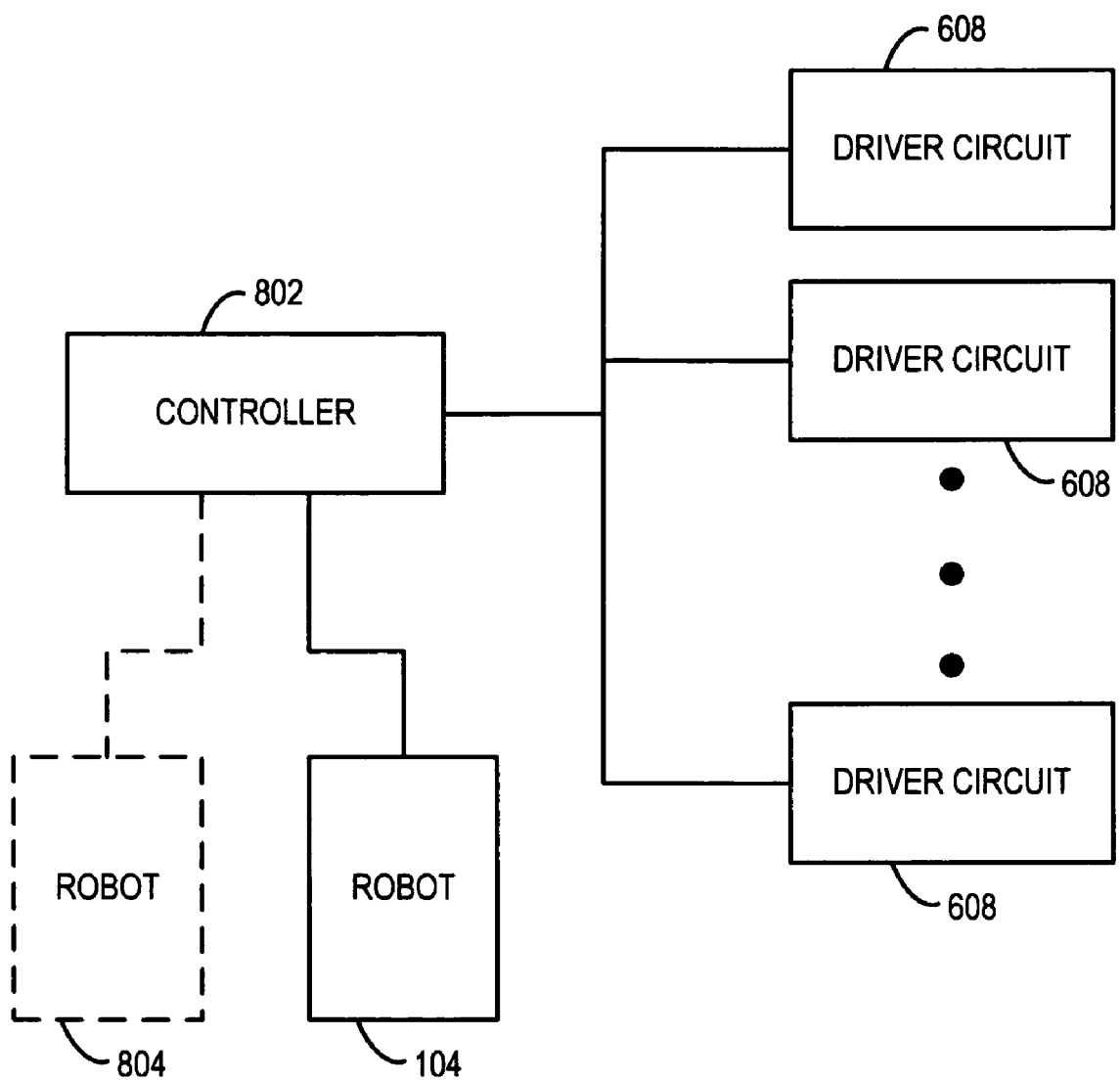
FIG. 8 is a block diagram showing a controller and other portions of the system of FIG. 1.

FIG. 8 is a block diagram showing a controller 802 and other control aspects and components of the system 100. Thus the controller 802 also constitutes part of the system 100, and may be constituted, for example, by a suitably programmed personal computer. The controller 802 may be in data communication with the driver circuits 608 at all of the docking locations to receive reports from the driver circuits of the events described in the previous paragraph and to track and control the duration of the burn-in procedures at all of the docking locations. The controller 802 may also be coupled to the robotic arm 104 (also shown in FIG. 1) so as to control the robotic arm so that it transports and manipulates DUTs, burn-in boards and/or trays in a manner to be described below. In some embodiments, if a second robot 804 is also included in the system to, e.g., divide tasks with the robotic arm 104 (as in an embodiment illustrated in FIG. 11), the controller 802 may be coupled as well to the second robot 804 to control operation thereof.

In some embodiments, the state of the "catastrophic" signal is passed from each driver circuit to the controller 802, and the controller 802, rather than the driver circuit, determines whether and when to shut off the power for the corresponding burn-in board and when to turn the power back on. The controller 802 may make this determination after sampling the "catastrophic" signal and determining that it has remained on for more than a pre-determined period of time.

Figure 9:
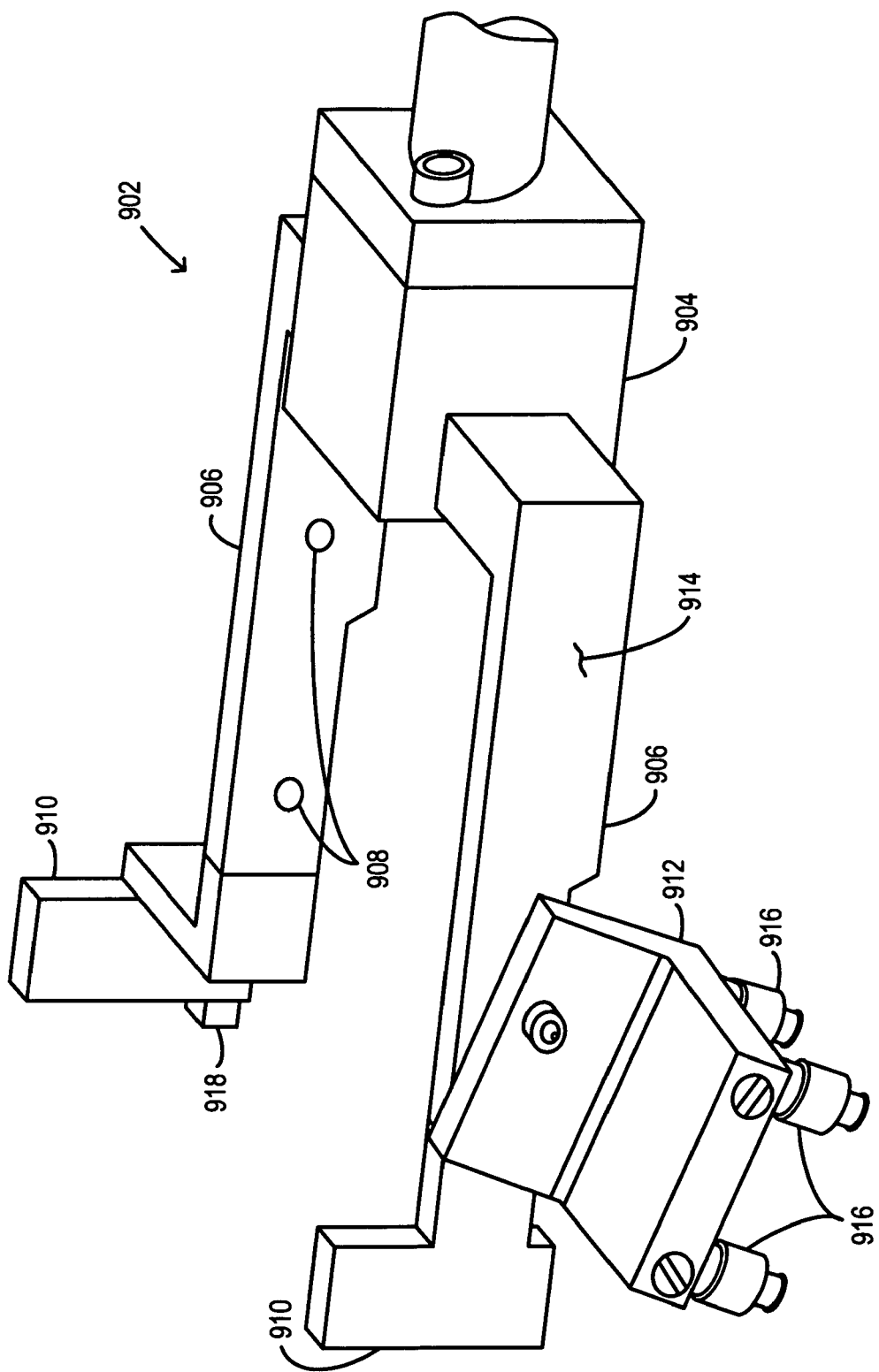
FIG. 9 is a perspective view of a robot end effector used in the system of FIG. 1.

FIG. 9 is a perspective view of a robot end effector 902 which is coupled to the end of the robotic arm 104 in accordance with some embodiments. In some embodiments, the end effector 902 is capable of four different functions, namely (1) handling DUTs, (2) handling burn-in boards, (3) handling trays and (4) detecting conditions in the system 100.

The end effector 902 may include a wrist portion 904 by which the end effector 902 may be connected to the robotic arm 104. In addition the end effector includes a first pair of opposed fingers 906 coupled to the wrist portion 904. These fingers may be pneumatic gripper fingers. A function of the fingers 906 is to engage burn-in boards so that the robotic arm may transport the burn-in boards. Each finger 906 may have an inwardly pointing pair of pins 908 to engage the holes 408 (FIG. 4) in the metal frame 406 of a burn-in board. (Only one of the two pairs of pins is visible in FIG. 9.) A distance between the fingers 906 may substantially correspond to a width of the burn-in boards to be transported by the robotic arm 104.

Continuing to refer to FIG. 9, the end effector may also include second fingers 910 each of which is coupled to an end of a respective one of the first fingers 906. Thus the second fingers 910 are coupled to the wrist portion 904 via the first fingers 906. The second fingers 910 may be suitably configured for engaging trays and transporting trays between tray holders 110 (FIG. 1), and also may be pneumatic gripper fingers. The second fingers 910 may have a length dimension that is perpendicular to the length dimension of the first fingers 906. The second fingers 910 may define a gap therebetween which is wider than the gap between the first fingers 906. The second fingers 910 may be offset slightly so as not to interfere with the vacuum head 912, which will now be discussed.

The vacuum head 912 may be coupled to the wrist portion 904 of the end effector 902 via one of the fingers 906. In particular, the vacuum head 912 may be mounted on an outer side 914 of the finger 906. A function of the vacuum head 912 is to engage DUTs to be transported by the robotic arm 104. The vacuum head 912 may be composed of a number of individual vacuum cups 916 arrayed so as to define a plane. For example, the vacuum head may include four vacuum cups (of which only three are visible in the drawing). In some embodiments, the vacuum for the vacuum head 912 is generated locally with air pressure, using the Bernoulli principle, rather than relying on a connection to a central source of vacuum.

In some embodiments, the end effector 902 may also include a laser distance detector 918 coupled to the wrist portion 904 of the end effector 902 via one of the fingers 906 and/or 910. The laser distance detector 918 may be employed by the system 100 to detect whether a burn-in board is present at a particular docking location, whether a DUT is installed in a particular burn-in board, whether a DUT is present on a tray, whether a tray is present in a tray holder, and/or to detect other conditions in the system 100. Having a laser distance detector 918 on the end effector 902 may be particularly helpful in enabling the system 100 to re-initialize in the event of a power outage, software disruption, etc.

In some embodiments, the robotic arm 104 may be a six-axis robotic arm, such as the model no. VS-6577-E available from Denso Robotics, Long Beach, Calif. In other embodiments, a "linear bearing" or "XYZ" type of robot may be used in place of the robotic arm referred to above.

The installation station 108 (FIG. 1) may operate in accordance with conventional principles to perform de-installation of a DUT from a burn-in board or installation of a DUT in a burn-in board. More specifically, the installation station 108, whether actuated by the robotic arm 104 or under its own power, may operate to open a socket on a burn-in board presented to the installation station so that a DUT may be removed from the socket. With the old DUT having been removed, a new DUT may thereafter be installed in the socket at the installation station. (Although not indicated in FIG. 8, the installation station may be controlled by the controller 802, and for that purpose may be coupled to the controller 802 by a signal path which is not shown.)

Figure 10:
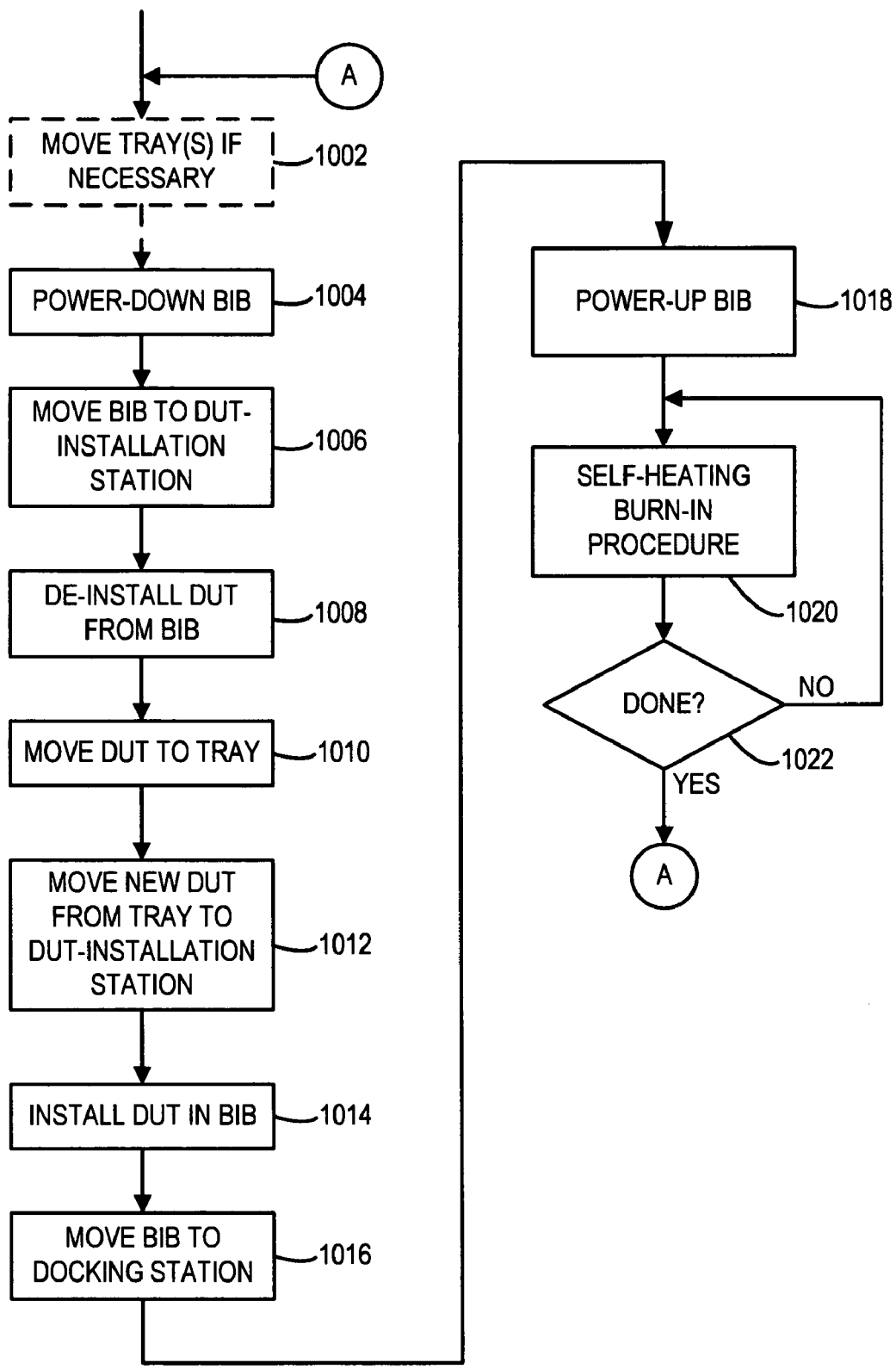
FIG. 10 is a flow chart that illustrates a process for performing a burn-in procedure in the system of FIG. 1.

FIG. 10 is a flow chart that illustrates a process for performing a burn-in procedure in the system 100 in accordance with some embodiments. Initially, as indicated at 1002, and if necessary at this stage of operation of the system 100, the controller 802 (FIG. 8) may control the robotic arm 104 to move one or more trays from one of the tray holders 110 (FIG. 1) to another of the tray holders. Then, assuming that a burn-in procedure has been completed for a DUT 112 installed in a burn-in board 106 (referred to by the acronym "BIB" in FIG. 10) at one of the docking locations 602, the controller 802 causes the driver circuit 608 at the docking location to cut off power to the DUT, as indicated at 1004 in FIG. 10. The controller then controls the robotic arm 104 to remove the burn-in board 106 from the docking location in question and transport the burn-in board to the installation station 108, as indicated at 1004. To explain this stage of the process in more detail, the controller controls the robotic arm 104 to position the end effector 902 at the docking location in question (unless the end effector was pre-positioned at the docking location in anticipation of the completion of the burn-in going on at the docking location). Then the robotic arm causes the fingers 906 (FIG.

9) to engage the burn-in board and to de-couple the burn-in board from the docking location. Once this has been done, the end effector is moved with the burn-in board engaged therein to present the burn-in board to the installation station 108, as indicated at 1006 in FIG. 10.

At this point, as indicated at 1008, the installation station 108 and the end effector 902 are operated to de-install the processed DUT from the burn-in board. Then, with the burn-in board remaining at the installation station 108, the robotic arm operates, as indicated at 1010, to transport the processed DUT to a tray located in the appropriate one of the tray holders 110. Next, the robotic arm operates, as indicated at 1012, to engage a new (to-be-processed) DUT in a tray at another one of the tray holders 110 and to transport the new DUT to the installation station 108. The installation station 108 is then operated to install the new DUT in the burn-in board, as indicated at 1014.

The robotic arm now operates, as indicated at 1016, to transport the burn-in board with the new DUT to the docking location from which the burn-in board was previously removed, and the robotic arm further operates to dock the burn-in board to the docking location. The driver circuit 608 (FIG. 6) then, as indicated at 1018, turns on the power supply for the burn-in board (and thus also for the new DUT installed on the burn-in board) in order to start the burn-in procedure for the new DUT. The self-heating burn-in procedure for the new DUT then proceeds, as indicated at 1020. As indicated at decision block 1022, the self-heating burn-in procedure continues until completed (or until the DUT fails), and the process then loops back to 1002 (if required) and 1004.

During the self-heating burn-in procedure, the driver circuit 608 (FIGS. 6 and 7) provides a suitable signal to the DUT to actuate the state machine 208 (FIG. 2) of the DUT, so that the state machine applies patterns to the core logic 206 to exercise the DUT during the burn-in procedure. The clock generation and selection block 204 (FIGS. 2 and 3) of the DUT initially provides the higher (e.g., 20 MHz) clock signal to the core logic 206 to rapidly toggle the gates of the DUT so that the DUT is rapidly raised to the target burn-in temperature. In some embodiments, the target temperature may be reached in, e.g., 15 seconds for a DUT that does not include a heat sink, or in about two to three minutes for a DUT that includes a heat sink. Once the target temperature is reached, the clock generation and selection block 204 may respond to the "too hot" signal 314 (FIG 3) provided by the thermal sensing circuit 202 by alternating between providing the higher clock signal and providing a lower clock signal (e.g., 10 MHz) to the core logic to aid in maintaining the internal DUT temperature at the target. In addition, the driver circuit 608 (FIG 6) also receives the "too hot" signal, and responds to the "too hot" signal by controlling the fan 612 to aid in cooling the DUT to maintain the DUT at the target temperature.

It is expected that the fan 612 and the lower clock signal will customarily keep the DUT at the target temperature. However, in the event of a "catastrophic" rise in temperature to, e.g., 10 or 12 degrees above the target temperature, the "catastrophic" signal 316 (FIG. 3) is asserted by the thermal sensing circuit 202 and is taken off at 320 to be provided to the driver circuit 608 (FIGS. 6 and 7). The assertion of the "catastrophic" signal immediately causes the clock signal from the multiplexer 304 (FIG. 3) to be gated off at the AND gate 306. Moreover, the driver circuit 608 responds to the "catastrophic" signal within about one second by cutting off the power for the DUT. The driver circuit 608 keeps the power off for a predetermined period (say about ten seconds) and then restores the power. When a cut-off of power occurs in response to the "catastrophic" signal, the driver circuit so informs the controller 802 (FIG. 8) of the system so that the controller 802 can add the power down time to the required burn-in period to insure that the full burn-in is applied to the DUT. (In other embodiments, as noted above, the controller 802 controls removal of power to the DUT in response to the "catastrophic" signal.)

Another event that is provided for, although not expected normally to occur, is a failure to properly install the DUT in the burn-in board. To deal with this possibility, the driver circuit 608 (FIGS. 6 and 7) may determine, when the burn-in board is powered up at 1018 (FIG. 10), whether the DUT properly begins to draw power and/or begins to function properly for burn-in, as may be indicated by a signal output from the DUT to the driver circuit. If not, faulty installation of the DUT in the socket is a possible cause, and accordingly the driver circuit may respond to the failure of the DUT to draw power or to begin functioning properly by signaling to the controller 802 to cause the controller to control the robotic arm so that the burn-in board is returned to the installation station 108 (FIG. 1) to reinstall the new DUT in the socket of the burn-in board.

The process of FIG. 10 is performed with respect to a single burn-in board associated with (customarily docked to) a single one of the docking locations of the system, and is performed more or less continuously. Thus the process of FIG. 10 results in a potentially endless sequence of DUTs being burned in at the docking location in question. It will be understood that essentially the same process may be simultaneously performed by the system 100 with respect to each one of the other docking locations of the system (e.g., dozens or hundreds of docking locations). Consequently, for example, dozens or hundreds of DUTs may at any one time be undergoing the burn-in procedure, each at a respective one of the docking locations. Also, at any given time, one of the burn-in boards may be undergoing the process of removal from its associated docking location, replacement of a processed DUT with a new DUT, and return of the burn-in board to the docking location, as indicated at 1006 to 1016 in FIG. 10. The number of docking locations and burn-in boards, and the duration of the burn-in period, may be such as to occupy the robotic arm substantially continuously with servicing the various docking locations. The servicing of the docking locations, and the performance of burn-in procedures at each docking location, are asynchronous, in that the timing at which a burn-in board is cycled to and from a docking location and the timing at which a burn-in procedure is performed at the docking location are independent of the timing of servicing and performing burn-in at any other docking location.

The system described with reference to FIGS. 1–10 may result in cost savings in a number of different ways. For example, capital costs incurred for sockets and burn-in boards may be substantially decreased, since the system of FIGS. 1–10 promotes very high (almost constant) utilization of burn-in boards and sockets. Moreover, wear on the burn-in board sockets may be reduced since a socket is opened only once for each exchange of a processed DUT for a new DUT. Also, when a single-socket burn-in board as described above needs to be scrapped because the socket has broken, it costs much less to replace the burn-in board than it would cost to replace a conventional 15-socket burn-in board because one of the 15 sockets has broken. Further, expensive facilities such as burn-in ovens and BLUs (burn-in loader/unloaders) can be dispensed with. Since these facilities are not needed, floor space requirements are also reduced, leading to further savings in capital costs.

Savings in labor costs may also be realized, since the burn-in process illustrated above only requires the operator to place stacks of trays with new DUTs in one tray holder and to remove trays of processed DUTs after a lapse of time during which processing occurs. This may eliminate several hand labor steps required either for conventional oven burn-in or for a self-heating burn-in process as proposed in the above-referenced related patent application.

The quality of the burn-in process may also be improved in the system of FIGS. 1–10. Since each docking location has facilities for individually cooling the DUT being burned in at the docking location, the actual burn-in temperature may be regulated to match the target temperature. Even in the case of variations in DUTs that involve high power dissipation by some of the DUTs, the capacity to interrupt the power supply if necessary on an individual basis allows the system to process all DUTs successfully, while tracking actual burn-in time to assure that the specified burn-in period is applied to each DUT.

Because of the relatively small amount of floor space required for the system of FIGS. 1–10, it may be feasible to integrate the burn-in process in the same factory floor area used for other testing process, rather than transporting the lots of DUTs to another area or building for burn-in, as is commonly done with conventional oven burn-in. Integration of burn-in facilities with other test locations may lead to additional improvements in throughput. Also, the burn-in process described herein may require less power than conventional oven burn-in processes.

The controller 802 referred to above may be programmed to track each and every DUT handled by the system, and to sort DUTs of different lots to the respective output trays for the lots. Consequently, more than one lot of DUTs may be processed in the system at a given time. The mixing of lots within the burn-in facility may lead to improved efficiency, less waiting time, and improved throughput.

The increased efficiency exhibited by the system of FIGS. 1–10 may make it feasible both to increase the proportion of each lot subjected to burn-in testing (to, e.g., 100% burn-in) and to decrease the duration of burn-in (to, e.g., 6 to 10 minutes).

The system of FIGS. 1–10 may also allow for more rapid and less expensive debugging and manufacturing processes for the burn-in boards.

If the burn-in time per DUT is decreased, as suggested above, the time required by the robotic arm to service each docking location may become a limiting factor on the throughput provided by the system. To address this issue, a modified system is proposed in accordance with embodiments described below in connection with FIGS. 11–20. Before describing the system of FIGS. 11–20 in detail, differences relative to the system of FIGS. 1–10 will be summarized:

(A) Installation station eliminated;

(B) Burn-in boards permanently docked to support structures;

(C) Robotic arm equipped to open sockets/install DUTs in burn-in boards at the support structures;

(D) Robotic arm equipped to transport and install multiple DUTs (e.g., six DUTs) at one time;

(E) Support structures oriented radially rather than tangentially relative to the robotic arm;

(F) Robotic arm equipped to hold one group of DUTs while de-installing or installing another group of DUTs;

(G) Additional robot provided to stage DUTs between tray holders and staging tray from/to which first robot transports DUTs.

Figure 11:
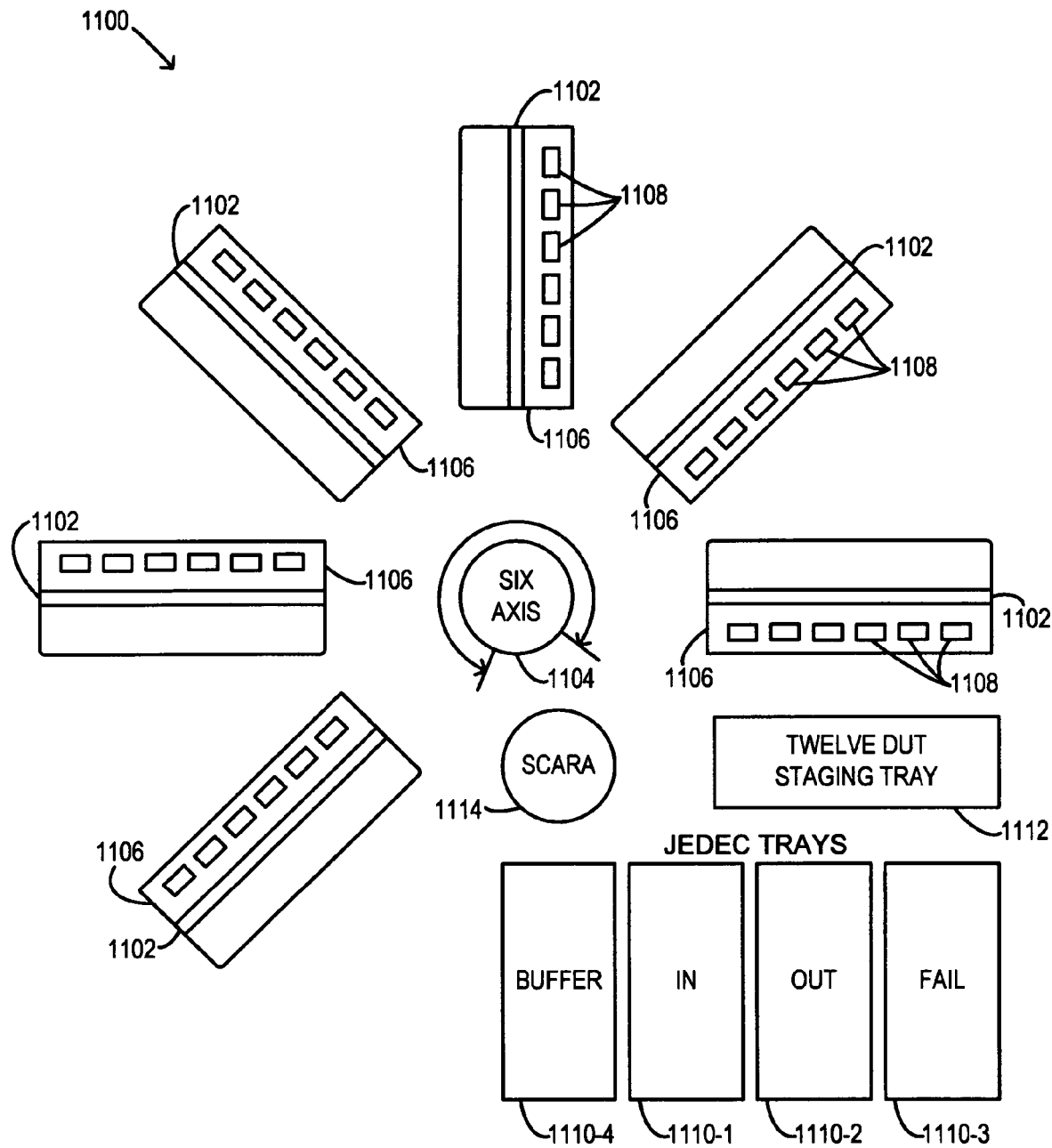
FIG. 11 is a schematic plan view of a system provided according to some other embodiments to perform self-heating burn-in of DUTs.

FIG. 11 is a schematic plan view of a system 1100 provided according to some embodiments to perform self-heating burn-in of DUTs. As noted above, the system shown in FIG. 11 is somewhat different in some respects from the system 100 of FIGS. 1–10.

The system 1100 includes a plurality of vertical support structures 1102 arranged at various radial positions around a robotic arm 1104 which is also part of the system 1100. Unlike the support structures 102 of the system 100 (FIG. 1), the support structures 1102 of the system 1100 are oriented radially so that the front sides of the support structures 1102 face tangentially rather than radially inwardly toward the robotic arm 1104. Each support structure 1102 may have mounted thereon several tiers of burn-in stations, with only one tier 1106 of burn-in stations being visible in FIG. 11 for each support structure 1102. Each burn-in station is represented by a respective burn-in socket 1108 shown in FIG. 11. Each socket 1108 may, like the socket 404 described with reference to FIGS. 4 and 5, be provided to receive and hold a DUT to be burned-in at the corresponding burn-in station. As used herein and in the appended claims, "burn-in station" refers to a location at which a socket is present to hold a DUT in situ for a burn-in procedure.

The system 1100 may also include a tray holder 1110-1 for holding trays of DUTs to be processed in the system, a tray holder 1110-2 for holding DUTs that were burned in successfully, a tray holder 1110-3 for holding DUTs that failed during burn-in, and a tray holder 1110-4 for holding empty trays. As will be understood from the discussion of tray holders 110 (FIG. 1) of system 100 and from other aspects of system 100, the number of tray holders included in system 1100 may be augmented if it is desired to process more than one lot of DUTs in the system 1100 at any given time.

The system 1100 may further include a staging tray 1112 that holds a group of (e.g., six) DUTs to be transported by the robotic arm 1104 to a tier 1106 of burn-in stations, and a group of (e.g., six) DUTs that have been processed at one of the tiers 1106 and have been transported from the tier to the staging tray. In addition, the system 1100 may include a second robotic arm 1114 to transport DUTs (individually and/or in groups) between the staging tray 1112 and the tray holders 1110-1, 1110-2 and 1110-3.

The robotic arm 1104 may, like the robotic arm 104 of system 100, be a so-called six-axis robotic arm. However, the robotic arm 1104 may have an end effector (examples shown in FIGS. 14–17 and 19 and discussed below) that is substantially different from the end effector 902 (illustrated in FIG. 9) which is part of the robotic arm 104 and which was described above. The second robotic arm 1114 may, in some embodiments, be a SCARA (selectively compliant articulated robot arm) or four-axis robot, such as the model HS-E 5 kg series available from Denso Robotics.

Figure 12:
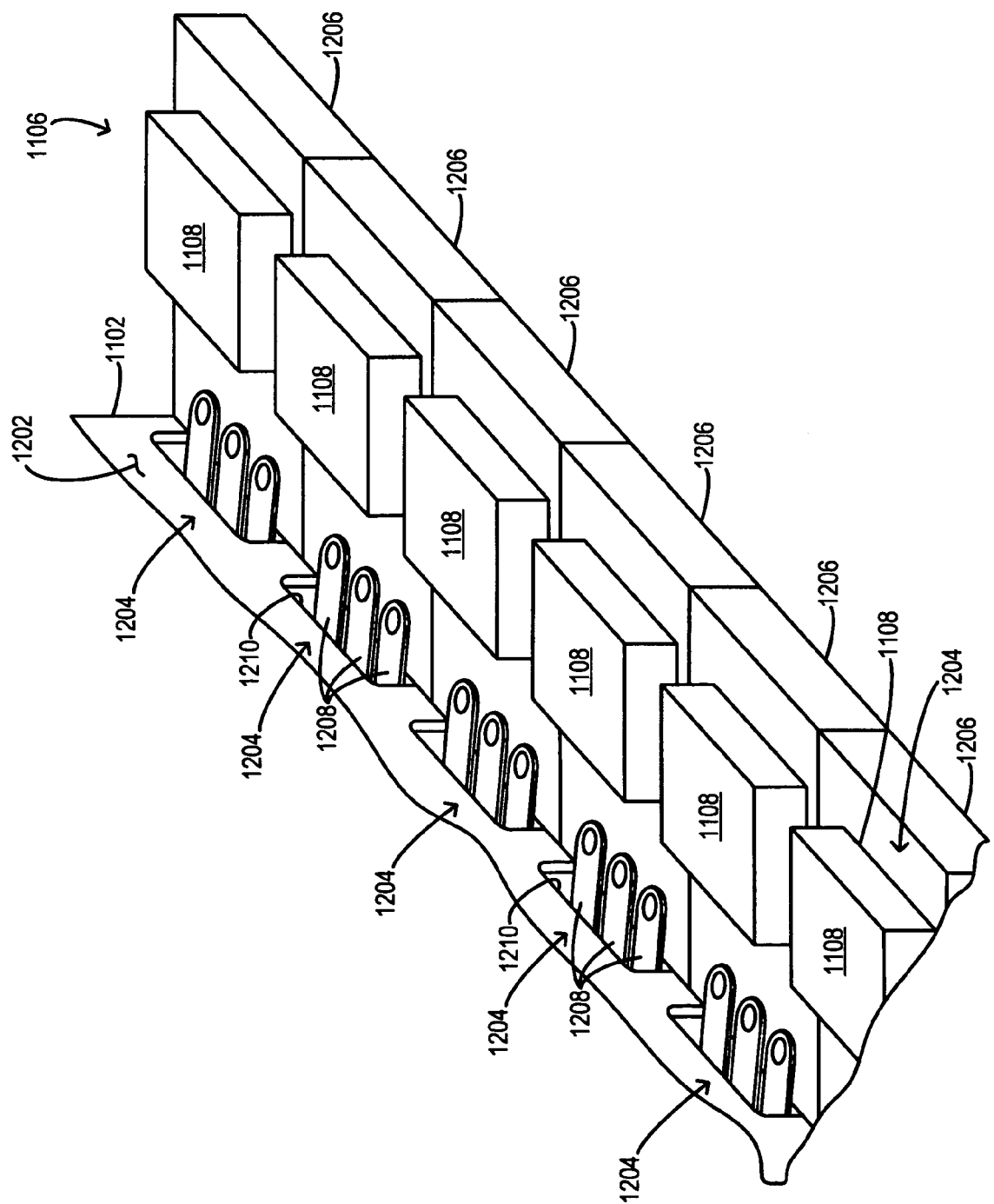
FIG. 12 is a partial isometric view of a tier of burn-in stations that is part of the system of FIG. 11.

FIG. 12 is a partial isometric view of one of the tiers 1106 of burn-in stations mounted on a front side 1202 of one of the support structures 1102. Each burn in station is indicated by a reference numeral 1204 and includes a respective burn-in board 1206. Each burn-in board 1206 may include a single one of the sockets 1108, and may otherwise resemble the burn-in board 106 illustrated in FIGS. 4 and 5, except that the burn-in board 1206 need not have an edge connector, since the burn-in boards 1206 may be permanently installed at the burn-in stations 1204 and may each be connected to a respective driver circuit (not shown in FIG.

12) via cables or strap connectors 1208 which extend through apertures 1210 in the support structure 1102 to the driver circuits.

Figure 13:
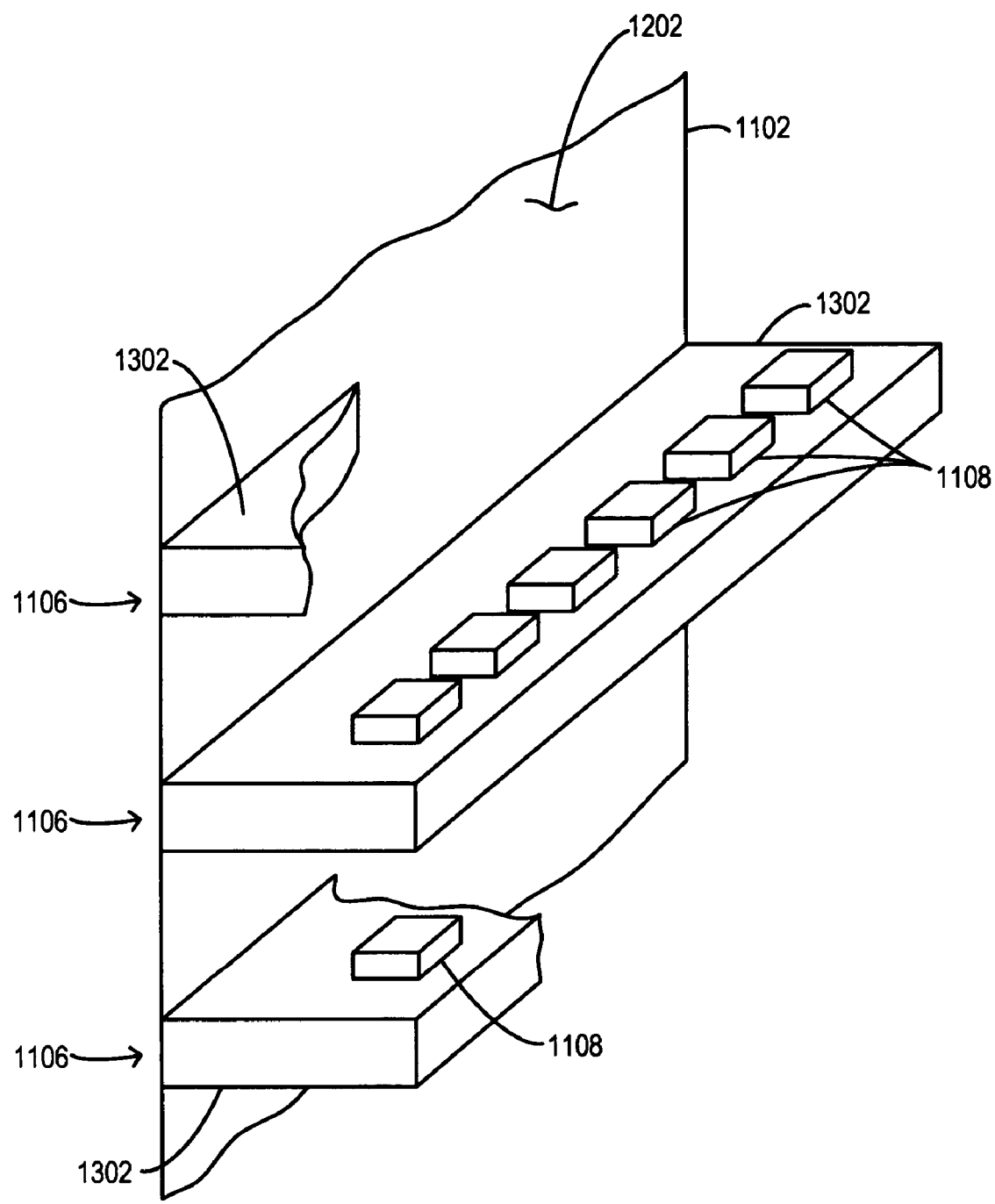
FIG. 13 is a partial isometric view of tiers of burn-in stations that may be part of the system of FIG. 11 according to some other embodiments

In some embodiments, two or more of the single-socket burn-in boards 1206 may be replaced by a burn-in board that includes more than one socket. For example, FIG. 13 shows, somewhat schematically, a burn-in board 1302 that has six sockets 1108. Thus the burn-in board 1302 may correspond to an entire tier 1106 of burn-in stations, each of which may correspond to one of the sockets 1108. As seen from FIG. 13, each of the burn-in boards 1302 may be permanently installed on the front side 1202 of a support structure 1102. Although only three tiers 1106 are shown in FIG. 13, in some embodiments each of the support structures 1102 may have more than three (e.g., seven) tiers of burn-in stations mounted thereon. It should also be understood that each burn-in station may also include the same or substantially the same driver circuit, fan and duct as were described in connection with the docking locations 602 (FIG. 6) of the system 100, although some of these components are not expressly shown in the drawings for the system 1100. Moreover, the DUTs to be burned-in in the sockets 1108 of the system 1100 may be the same as those described above in connection with FIGS. 2 and 3.

Figure 14:
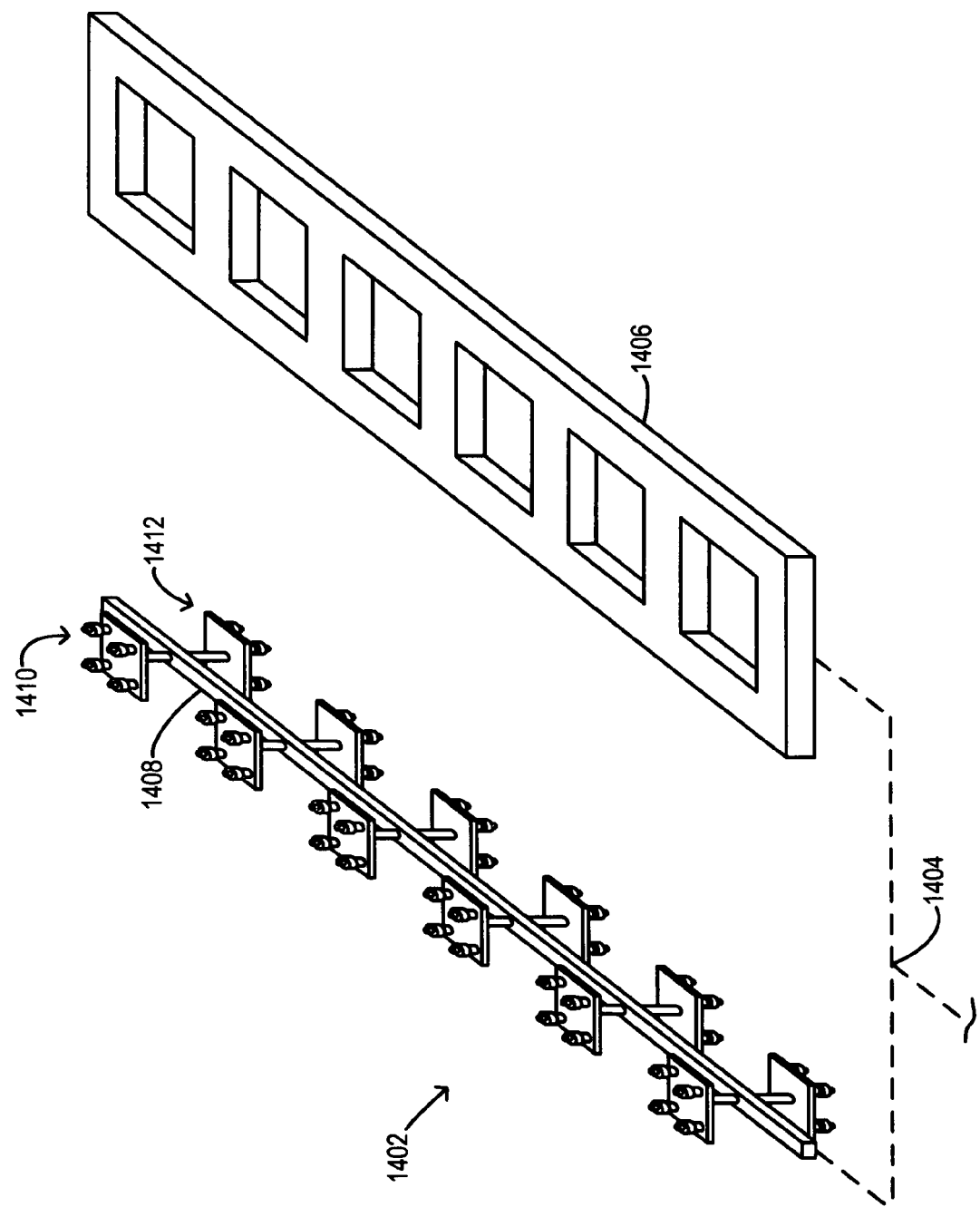
FIG. 14 is a schematic isometric view of a robot end effector that may be used in the system of FIG. 11.

FIG. 14 is a schematic isometric view of a robot end effector 1402 that may be mounted on the robotic arm 1104 used in the system 1100. The end effector 1402 includes a wrist portion (schematically indicated at 1404) by which the end effector 1402 may be connected to the robotic arm 1104 (FIG. 11, not shown in FIG. 14). The end effector 1402 also includes a socket-opening member 1406 which is mounted on the wrist portion 1404. The socket-opening member 1406 is configured to simultaneously press down on all (e.g., six) sockets 1108 (FIG. 12 or FIG. 13, not shown in FIG. 14) of a tier 1106 of burn-in stations 1204 to simultaneously open all of the sockets 1108. As expressed with a colloquial term used by those who are skilled in the art, the socket-opening member 1406 is configured to simultaneously "stomp" all of the sockets 1108 of a tier 1106.

The end effector 1402 further includes a shaft 1408 mounted on the wrist portion 1404 and extending parallel to the socket-opening member 1406. In addition, the end effector 1402 includes a first linear array 1410 of vacuum heads mounted along the shaft 1408 and a second linear array 1412 of vacuum heads mounted along the shaft 1408. For example, each of the arrays 1410, 1412 may include six vacuum heads to simultaneously hold and transport six DUTs. As seen from FIG. 14, there may be a 180° difference in orientation between the arrays 1410, 1412. That is, when the array 1410 is facing directly upward, the array 1412 may face directly downward. As best seen from FIG. 17, the shaft 1408 may be mounted to the wrist 1404 in such a manner as to allow the shaft 1408 to be rotated about its longitudinal axis, thereby allowing the orientation of the two arrays 1410 and 1412 to be shifted between an upward orientation and a downward orientation.

Each vacuum head may include four vacuum cups. As in the case of the end effector 902 described above, in some embodiments the vacuum for the vacuum heads of the arrays 1410, 1412 may be generated locally with air pressure, using the Bernoulli principle, rather than by a connection to a central source of vacuum.

Figure 15:
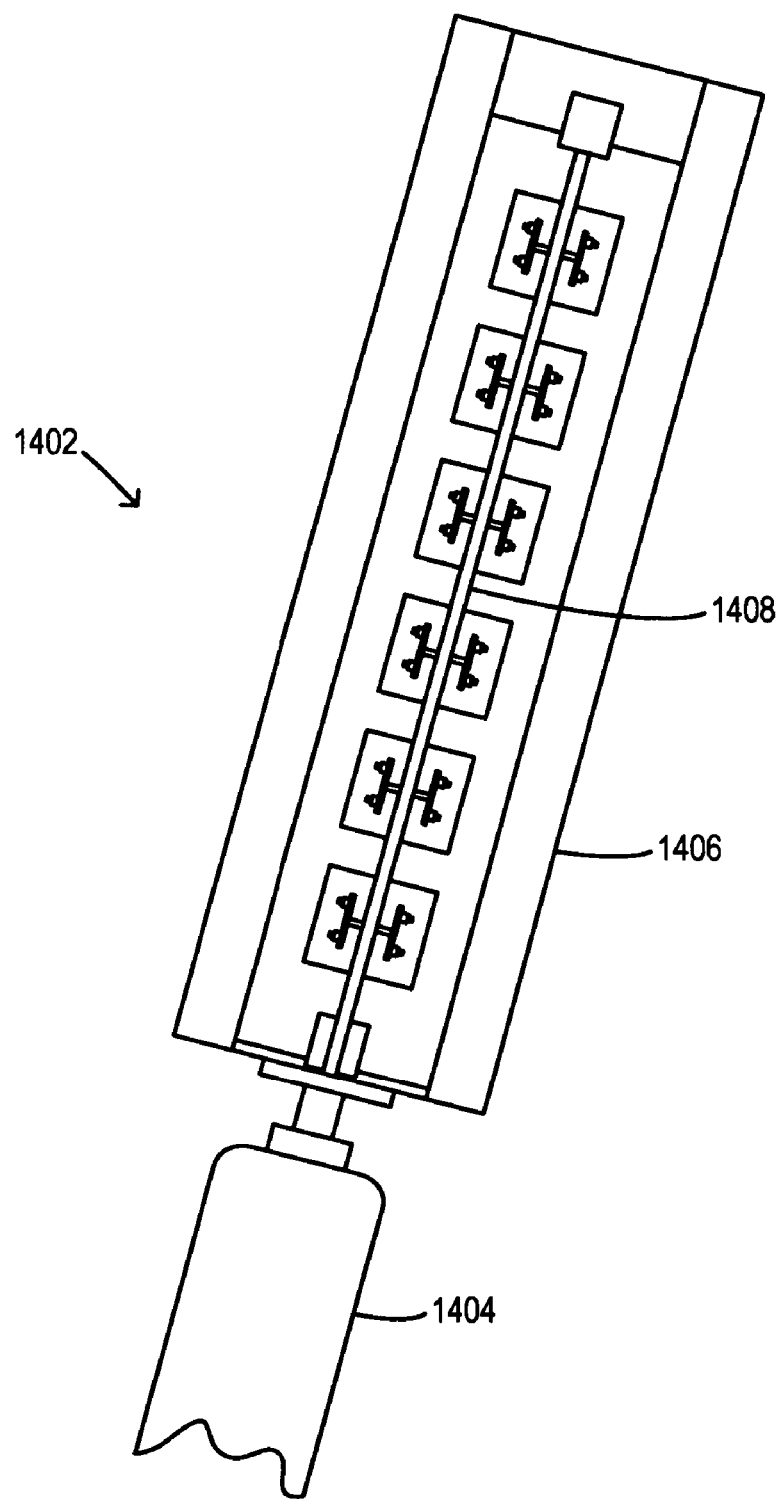
FIG. 15 is a schematic plan view of the robot end effector of FIG. 14
Figure 16:
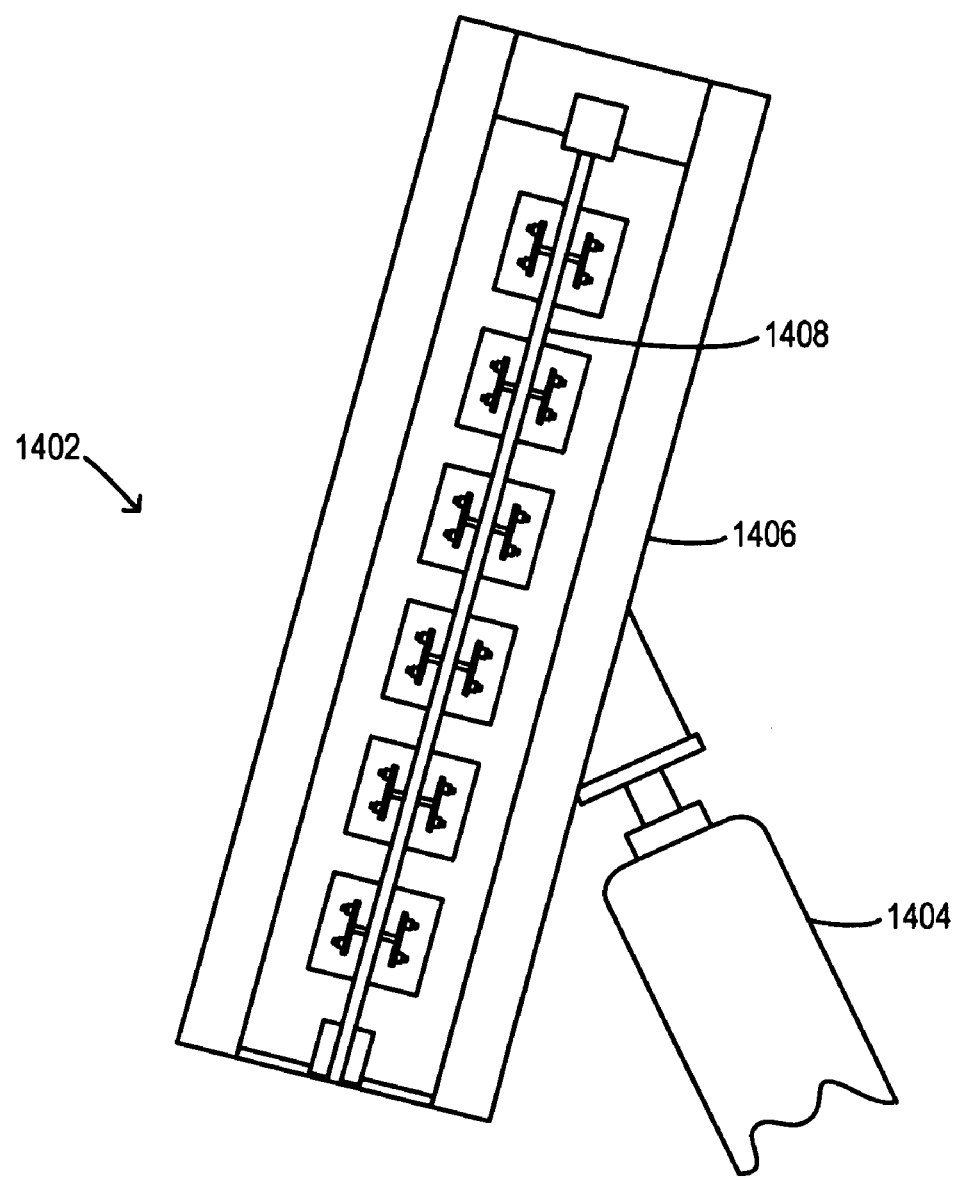
FIG. 16 is a view similar to FIG. 15 showing an alternative embodiment of the robot end effector of FIGS. 14 and 15.

In some embodiments, illustrated in FIG. 15, the socket-opening member 1406 and the shaft 1408 may be aligned with the wrist portion 1404, and may be mounted to the wrist portion 1404 by respective ends of the member 1406 and of the shaft 1408. In other embodiments (illustrated in FIG. 16), if necessary or desirable to reduce the moment of inertia of the end effector 1402, the socket-opening member 1406 and the shaft 1408 may be angled relative to the wrist portion 1404, and may be mounted to the wrist portion 1404 at a central location along the member 1406 and the shaft 1408.

Figure 17:
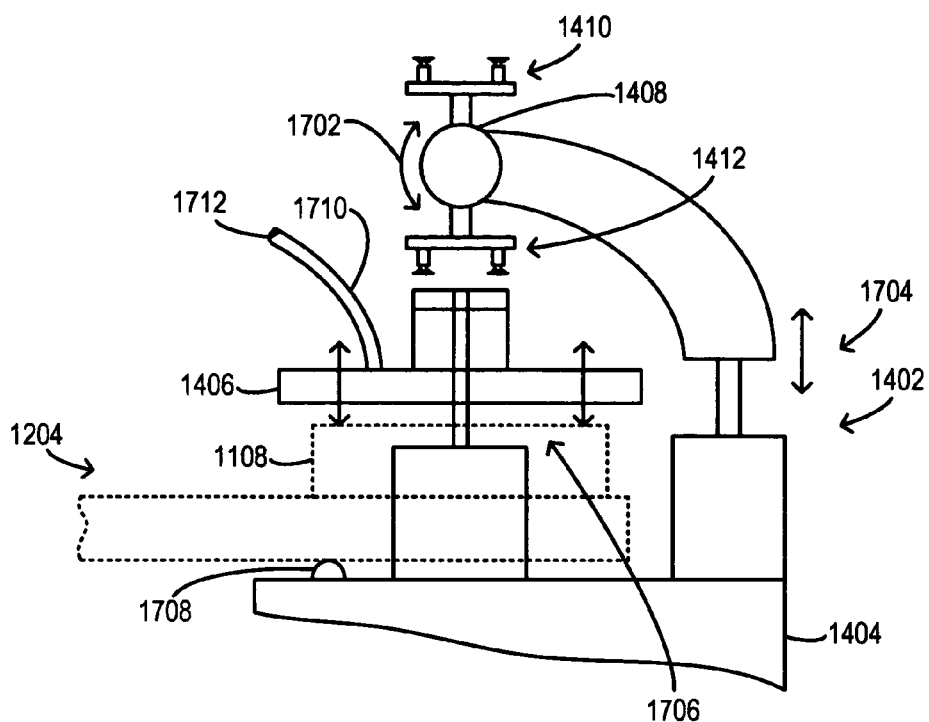
FIG. 17 is a schematic side view of the robot end effector of FIGS. 14 and 15.

FIG. 17 is a schematic side view of the robot end effector 1402 as it interacts with one of the burn-in stations 1204, and particularly with a socket 1108 of the burn-in station 1204 (both shown in phantom).

As suggested by prior discussion, the end effector 1402 includes a mechanism (e.g., a 180° pneumatic rotor) schematically indicated at 1702 to rotate the shaft 1408 about its longitudinal axis to change the orientation of the vacuum head arrays 1410, 1412 from upward-facing to downward-facing, and vice versa. Also included in the end effector 1402 is a mechanism schematically indicated at 1704 to raise and lower the shaft 1408 so that a DUT (not shown) held by a vacuum head of one of the arrays 1410, 1412 may be presented to or removed from the socket 1108. In addition, the end effector 1402 includes a mechanism schematically indicated at 1706 to raise and lower the socket-opening member 1406 to actuate "stomping" of the socket 1108.

A tooling ball 1708 may be provided on the end effector 1402 to aid in aligning the end effector 1402 with the burn-in station 1204. For example, the tooling ball may interact with a feature such as a groove or indentation (not separately shown) on the burn-in station.

The end effector 1402 may also include a finger 1710 mounted on the socket-opening member 1406. The finger 1710 has a tip 1712 that extends forwardly of the socket-opening member 1406. The finger 1710 may be provided, as described below in connection with FIG. 19, to push a pivotable nozzle portion (not shown in FIG. 17) of an air duct (not shown in FIG. 17) for the burn-in station 1204.

Figure 18:
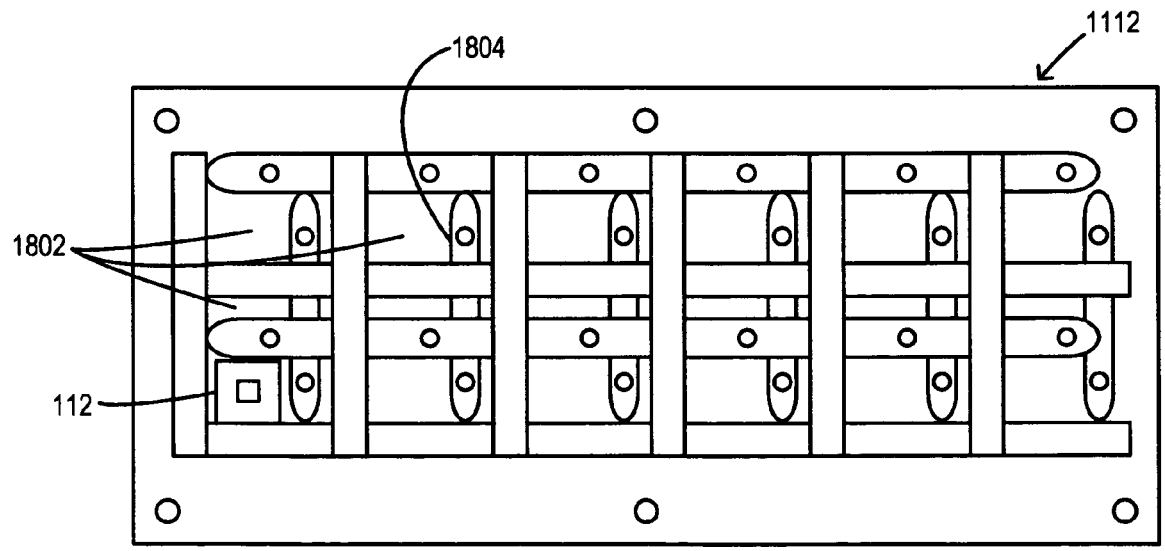
FIG. 18 is a schematic plan view of a staging tray for DUTs that is part of the system of FIG. 11.

FIG. 18 is a schematic plan view of the staging tray 1112 (seen in FIG. 11 as part of the system 1100). Referring to FIG. 18, the staging tray 1112 may include, for example, a 2×6 array of compartments 1802, each of which is configured to hold a respective DUT (only one DUT 112 shown in the drawing). A mechanism 1804 that is shown in phantom may be included in the staging tray 1112 to adapt the sizes of the compartments to match the size of the DUTs to be held in the staging tray 1112. One row of the compartments 1802 may, at times, hold DUTs staged at the tray 1112 on the way from the tray holder 1110-1 (FIG. 11) to a tier of burn-in stations. The other row of compartments 1802 may, at times, hold DUTs staged at the tray 1112 on the way from a tier of burn-in stations to the tray holder 1110-2 or the tray holder 1110-3 (FIG. 11), as the case may be. The robotic arm 1114 may operate to transport DUTs between the staging tray 1112 and the tray holders 1110-1, 1110-2, 1110-3. The robotic arm 1104 may operate to transport DUTs, in groups of six for example, between the staging tray 1112 and the burn-in stations on the support structures 1102. In one visit by the robotic arm 1104 to the staging tray 1112, one array of vacuum heads of the robotic arm 1104 may simultaneously deposit six processed DUTs in a row of the compartments 1802, and immediately before or after so doing, the other array of vacuum heads may simultaneously pick up six to-be-processed DUTs from the other row of the compartments 1802. (In the event that picking up the to-be processed DUTs follows the depositing of the processed DUTs, the same array of vacuum heads may be used for both operations.)

To assure interoperability of the end effector 1402 with the tiers 1106 of burn-in stations 1204 and with the staging tray 1112, it may be desirable to have the linear spacing of the vacuum heads of the end effector match the linear spacing of the sockets 1108 of the tiers 1106. Also, it may be desirable for the linear spacing of the compartments 1802 of the staging tray 1112 to match the linear spacing of the vacuum heads of the end effector 1402.

Figure 19:
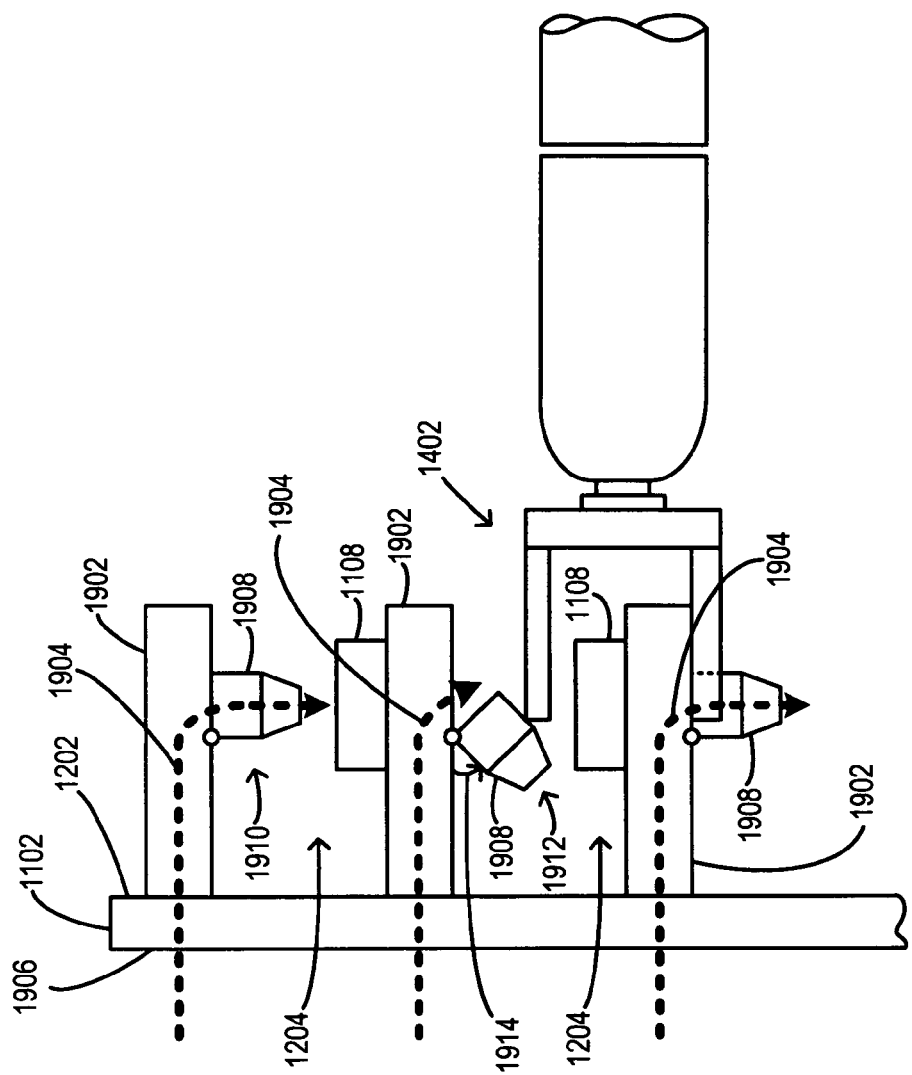
FIG. 19 is a schematic side view showing the end effector of FIGS. 14 and 15 interacting with a burn-in station of the system of FIG. 11.

FIG. 19 is a schematic side view showing the end effector 1402 (portions of end effector omitted to simplify the drawing) interacting with a burn-in station 1204 of the system 1100. FIG. 19 shows aspects of some embodiments of the burn-in station that are omitted from other drawings.

As in the embodiment of FIG. 6, each burn-in station includes a duct 1902 to direct a flow of air (represented by arrow 1904) from a fan (not shown) mounted on the rear side 1906 of the support structure 1102 toward the socket 1108 of the burn-in station. As before, each duct may be integrated in a support member (also indicated by reference numeral 1902) which supports the burn-in board (not separately shown) of the burn-in station. Each duct/support member 1902 may include a nozzle 1908, to complete the airflow path. The nozzle 1908 may be pivotable between a first position (indicated at 1910) in which the nozzle 1908 points downwardly toward the socket 1108 of the burn-in station and a second position (indicated at 1912) in which the nozzle 1908 is deflected toward the support structure 1102 to accommodate the end effector accessing the socket. The nozzle 1908 may be deflected by being pushed by the finger 1710 (FIG. 17, not shown in FIG. 19) of the end effector 1402. There may be associated with each nozzle 1908 a spring or other bias device (schematically indicated at 1914) to bias the nozzle from the second position to the first position.

The control architecture illustrated in FIG. 8 is also applicable to the system 1100 illustrated in FIGS. 11–19. That is, the system 1100 may also include a controller 802 (FIG. 8), such as a suitably programmed personal computer that is in communication with and controls robotic arms 1104, 1114 (FIG. 11, indicated as robots 104, 804 in FIG. 8). The controller may also be in communication with driver circuits at the burn-in stations of the system 1100.

Figure 20:
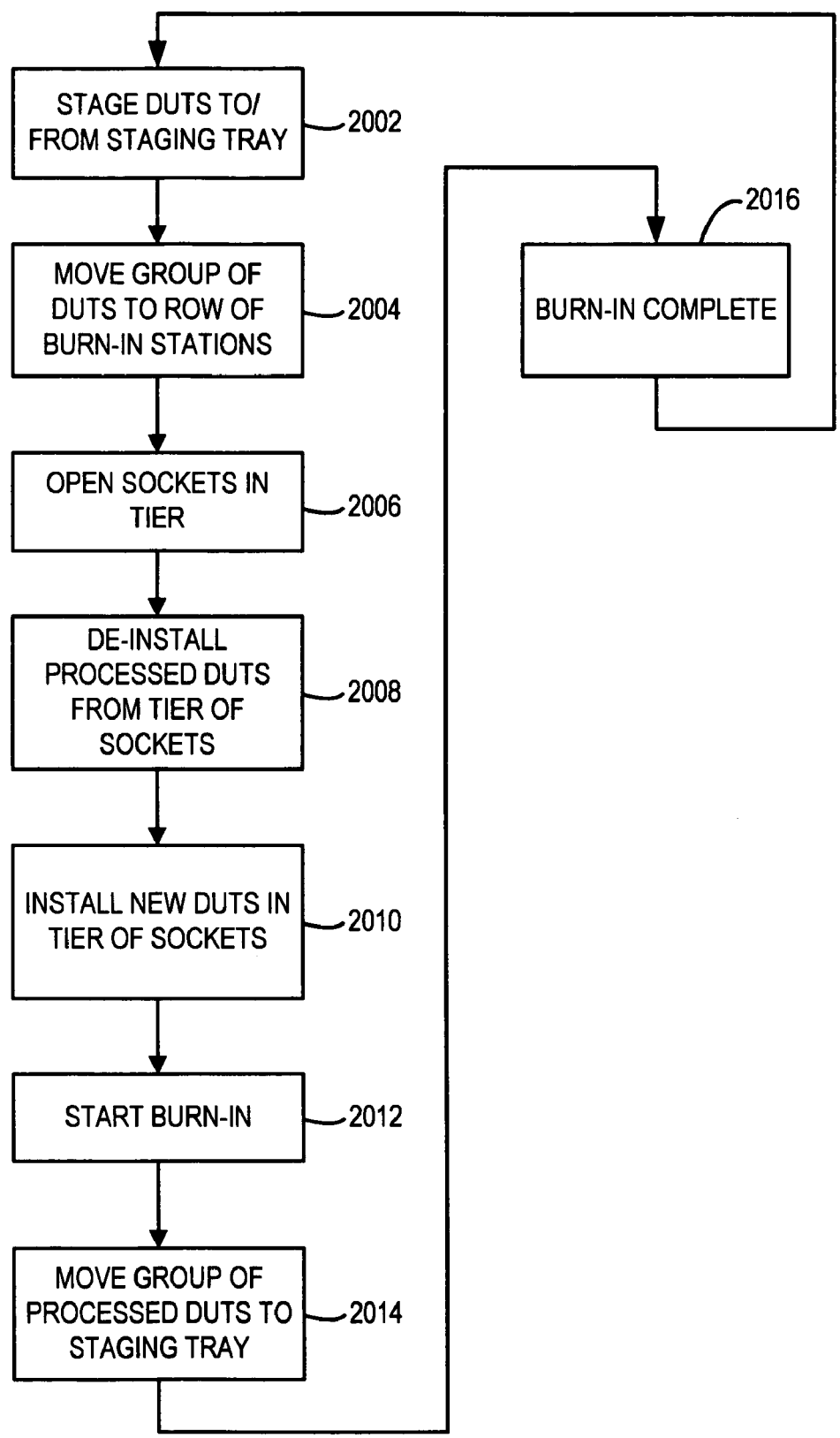
FIG. 20 is a flow chart that illustrates a process for performing a burn-in procedure in the system of FIG. 11.

FIG. 20 is a flow chart that illustrates a process for performing a burn-in procedure in the system 1100. Initially, as indicated at 2002, the controller 802 (FIG. 8) may control the robotic arm 1114 (FIG. 11) to transport processed DUTs from the staging tray 1112 to the tray holder 1110-2 or 1110-3, as the case may be, and to transport to-be-processed DUTs from tray holder 1110-1 to the staging tray 1112. (Staging of DUTs between the tray holders and the staging tray may overlap in time with the robotic arm 1104 servicing a tier of burn-in stations, as described below) Then, as indicated at 2004, the controller 802 controls the robotic arm 1104 to use one of its arrays of vacuum heads to simultaneously pick up a group of new (to-be-processed) DUTs from a row of compartments of the staging tray 1112 and to transport the group of new DUTs to a tier of burn-in stations at which there are DUTs for which a burn-in procedure has just been completed.

With the new DUTs present at the tier of burn-in stations, the controller 802 causes the robotic arm 1104 to use its socket-opening member 1406 (FIG. 14) to simultaneously open all of the sockets of the tier of burn-in stations, as indicated at 2006 in FIG. 20. With the new DUTs held by one of the arrays 1410, 1412 of vacuum heads in proximity to the sockets, the robotic arm 1104, under control of the controller, uses the other one of the arrays of vacuum heads to de-install (2008, FIG. 20) the respective processed DUTs from each of the sockets of the tier of burn-in stations. Then, as indicated at 2010, with the processed DUTs held in proximity to the sockets by one of the arrays of vacuum heads, the robotic arm 1104 uses the other of the arrays to install the new DUTs in the sockets of the tier of burn-in stations. Thus, all of the processed DUTs are removed simultaneously from the sockets of the tier of burn-in stations, then shortly thereafter, all of the new DUTs are installed simultaneously in the sockets of the tier of burn-in stations.

Next, as indicated at 2012, the driver circuits for the tier of burn-in stations turn on the power supplies for the burn-in boards at the burn-in stations to start the burn-in procedure for the new DUTs installed in the sockets of the tier of burn-in stations. While the burn-in procedure starts and continues, the robotic arm 1104 transports (2014, FIG. 20) the group of processed DUTs just removed from the tier of burn-in stations to the staging tray. In the same visit for dropping off the processed DUTs in the staging tray, the robotic arm 1104 may pick up from the staging tray a group of new DUTs to be processed at another tier of burn-in stations for which the burn-in process is (or is about to be) complete (2016, FIG. 20). Thus the process of exchanging new DUTs for processed DUTs may be performed in turn for every tier of burn-in stations of the system 1100, and may be repeated over and over again for each tier of burn-in stations upon completion of each burn-in procedure performed at a given tier of burn-in stations.

The DUT and the driver circuit at each burn-in station may perform in the same manner as was described above in connection with the system 100. (Indeed, since burn-in procedures are performed at each of the docking locations of the system 100, those docking locations may also be considered to be "burn-in stations".)

The system 1100 described with reference to FIGS. 11–20 may exhibit most if not all of the advantages enumerated above with respect to the system 100. In addition, the system 1100 may exhibit one or more of the following advantages:

(1) The average cycle time required to exchange DUTs at each burn-in station may be substantially reduced, since only DUTs and not burn-in boards are transported, and several (e.g., six) burn-in stations are serviced in parallel. This may facilitate institution of burn-in testing for larger samples or 100% of device lots with a shorter burn-in time.

(2) Wear and tear on the burn-in boards and the burn-in stations (and particularly on the connection therebetween) may be substantially reduced, since burn-in boards are essentially permanently installed at the burn-in stations and so are not docked to and undocked from the burn-in stations at each cycle.

Figure 21:
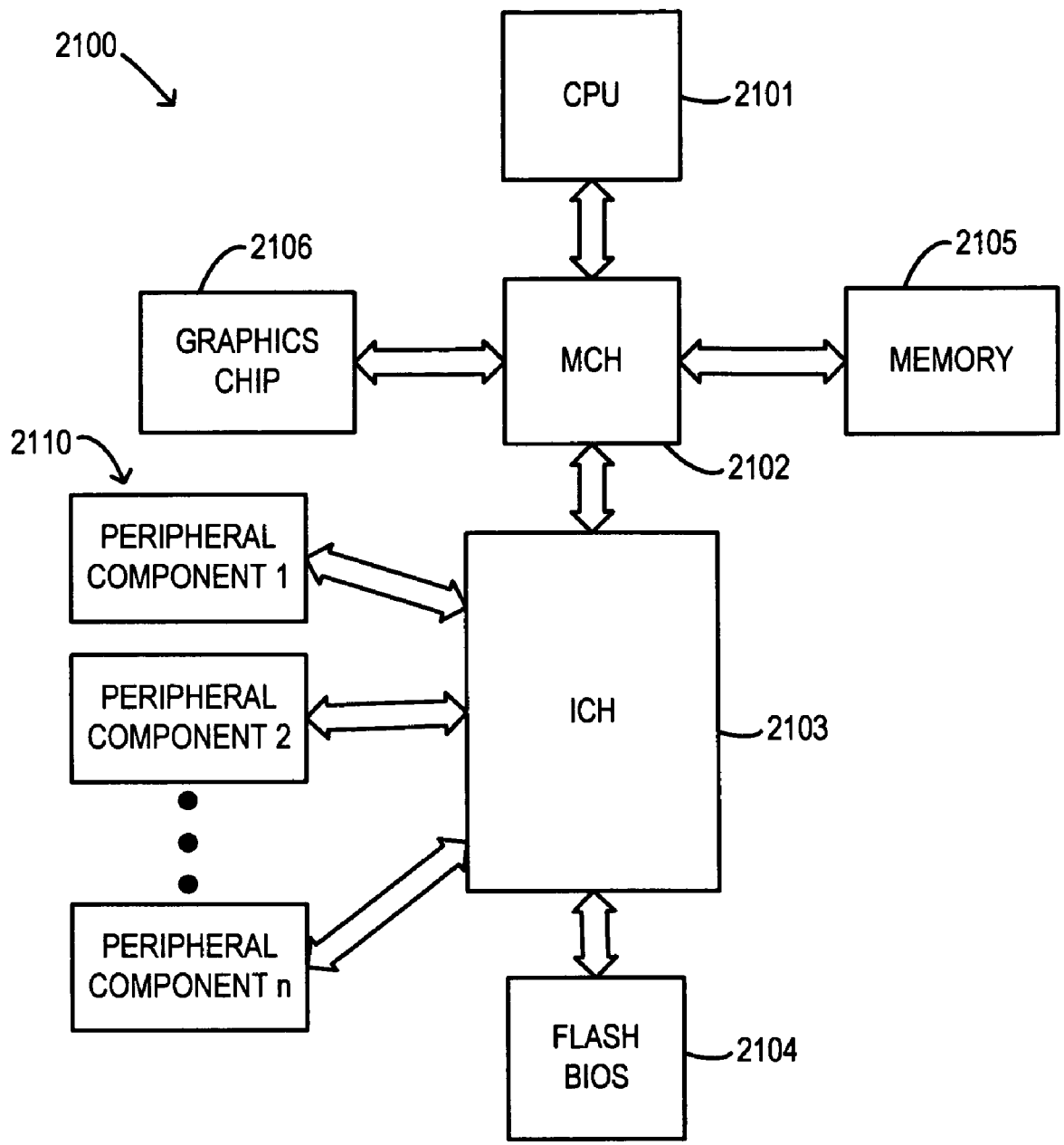
FIG. 21 is a block diagram representation of a computer system that may include a device like the DUT of FIGS. 2 and 3.

In one embodiment, a device with on-die DFT as described above is part of a chipset incorporated in a computer system. The chipset may include a memory controller hub (MCH), an input/output controller hub (ICH), a graphics chip, etc. FIG. 21 shows an exemplary embodiment of a computer system 2100. The system 2100 includes a central processing unit (CPU) 2101, a MCH 2102, an ICH 2103, a flash memory device storing the Basic Input Output System (Flash BIOS) 2104, a memory device 2105 (e.g., a dynamic random access memory or "DRAM"), a graphics chip 2106, and a number of peripheral components 2110. The CPU 2101, the memory device 2105, the graphics chip 2106, and the ICH 2103 are coupled to the MCH 2102. Data sent and received between the CPU 2101, the memory device 2105, the graphics chip 2106, and the ICH 2103 are routed through the MCH 2102. The peripheral components 2110 and the flash BIOS 2104 are coupled to the ICH 2103.

The peripheral components 2110 and the flash BIOS 2104 communicate with the CPU 2101, the graphics chip 2106, and the memory 2105 through the ICH 2103 and the MCH 2102. Note that any or all of the components of system 2100 and associated hardware may be used in various embodiments of the present invention. However, it can be appreciated that other embodiments of the computer system may include some or all of the devices.

Any or all of the robotic arms described herein may be considered to be a "transporter" since all transport DUTs and/or other items from place to place within the systems 100 or 1100. This same term may also be applied to any other device used in place of one or more of the robotic arms to transport a DUT, a burn-in board or a tray.

In some modified embodiments of the system 1100, DUTs are transported individually to each burn-in board/burn-in station, rather than being transported in groups. In such embodiments, the end effector of the robotic arm 1104 may be configured to "stomp" only one socket at a time, and to hold only one or only two DUTs at a time.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A system comprising:
    a support structure;
    a plurality of burn-in stations arrayed on the support structure;
    a plurality of burn-in boards mounted on the support structure, each burn-in board including at least one socket, each socket at a respective one of the burn-in stations, each socket further being adapted to receive a device under test (DUT) to be burned-in at the respective burn-in station;
    a tray adapted to hold DUTs; and
    a transporter adapted to transport the DUTs from the tray to the burn-in stations and to install the DUTs in the sockets at the burn-in stations;
    wherein the transporter is operative to place one of the DUTs at a respective one of the burn-in stations at a time when others of the DUTs are being burned-in at respective ones of the burn-in stations.

2. The system of claim 1, wherein the transporter is a first transporter and the tray is a staging tray, the system further comprising:
    a tray holder; and
    a second transporter adapted to transport the DUTs from the tray holder to the staging tray.

3. The system of claim 2, wherein the first transporter includes a first robotic arm and the second transporter includes a second robotic arm.

4. The system of claim 1, wherein the transporter is adapted to simultaneously transport a plurality of DUTs, and, after said transporting, to simultaneously install each of the plurality of DUTs in a respective one of the sockets.

5. The system of claim 1, wherein the transporter is adapted to de-install a first DUT from one of the sockets while holding a second DUT in proximity to said one of the sockets and then to install the second DUT in said one of the sockets while holding the first DUT in proximity to said one of the sockets.

6. The system of claim 1, wherein each burn-in board has no more than one socket.

7. The system of claim 1, further comprising a plurality of cooling devices, each mounted at a respective one of the burn-in stations, the cooling devices being equal in number to the burn-in stations.

8. The system of claim 7, further comprising a plurality of driver circuits, each mounted at a respective one of the burn-in stations to control a respective cooling device at the respective one of the burn-in stations based on a signal output from a respective DUT at the respective one of the burn-in stations, the driver circuits being equal in number to the burn-in stations.

9. The system of claim 8, wherein the cooling devices are fans.

10. The system of claim 8, further comprising a controller in communication with the driver circuits and with the transporter to control the driver circuits and the transporter.

11. The system of claim 10, wherein each of the driver circuits controls a source of power for a respective socket at the burn-in station at which said each driver circuit is mounted.

12. The system of claim 11, wherein the burn-in boards are mounted on a first side of the support structure and the fans and driver circuits are mounted on a second side of the support structure opposite to the first side of the support structure.

13. The system of claim 1, wherein the plurality of burn-in stations comprises at least twelve burn-in stations.

14. A system comprising:
    a support structure;
    a plurality of burn-in stations arrayed on the support structure;
    a plurality of burn-in boards mounted on the support structure, each burn-in board including at least one socket, each socket at a respective one of the burn-in stations, each socket further being adapted to receive a device under test (DUT) to be burned-in at the respective burn-in station;
    a tray adapted to hold DUTs; and
    a transporter adapted to transport the DUTs from the tray to the burn-in stations and to install the DUTs in the sockets at the burn-in stations;
    wherein each of the burn-in stations includes a respective driver circuit to control a source of power for the respective socket at said each burn-in station.

15. The system of claim 14, wherein the burn-in boards are mounted on a first side of the support structure and the drive circuits are mounted on a second side of the support structure opposite to the first side of the support structure.

* * * * *